United States Patent
Kitano

(10) Patent No.: US 11,770,629 B2
(45) Date of Patent: Sep. 26, 2023

(54) SOLID-STATE IMAGING ELEMENT AND IMAGING DEVICE

(71) Applicant: SONY SEMICONDUCTOR SOLUTIONS CORPORATION, Kanagawa (JP)

(72) Inventor: Shin Kitano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/952,663

(22) Filed: Sep. 26, 2022

(65) Prior Publication Data

US 2023/0011899 A1    Jan. 12, 2023

Related U.S. Application Data

(63) Continuation of application No. 17/276,231, filed as application No. PCT/JP2019/036623 on Sep. 18, 2019, now Pat. No. 11,503,233.

(30) Foreign Application Priority Data

Sep. 27, 2018 (JP) ................................. 2018-181151

(51) Int. Cl.
*H04N 25/63* (2023.01)
*H04N 25/50* (2023.01)
(Continued)

(52) U.S. Cl.
CPC ............ *H04N 25/63* (2023.01); *H04N 25/50* (2023.01); *H04N 25/633* (2023.01); *H04N 25/77* (2023.01)

(58) Field of Classification Search
CPC .. H04N 5/2353; H04N 5/37455; H04N 5/378; H04N 5/2628; H04N 5/23245;
(Continued)

(56) References Cited

U.S. PATENT DOCUMENTS

2010/0007780 A1* 1/2010 Nishihara ............. H04N 5/335
                                                         348/311
2014/0009648 A1   1/2014 Kim et al.
(Continued)

FOREIGN PATENT DOCUMENTS

EP      3324611       5/2018
JP    2017-535999    11/2017
(Continued)

OTHER PUBLICATIONS

International Search Report and Written Opinion for International (PCT) Patent Application No. PCT/JP2019/036623, dated Dec. 17, 2019, 6 pages.
(Continued)

*Primary Examiner* — Xi Wang
(74) *Attorney, Agent, or Firm* — Sheridan Ross PC

(57) ABSTRACT

The signal quality of a solid-state imaging element configured to detect address events is enhanced. The solid-state imaging element has open pixels and light-blocked pixels arrayed therein. In the solid-state imaging element, the open pixels each detect whether or not an amount of change in incident light amount exceeds a predetermined threshold, and output a detection signal indicating a result of the detection. On the other hand, in the solid-state imaging element, the light-blocked pixels each output a correction signal based on an amount of noise generated in the open pixels each configured to detect whether or not an amount of change in incident light amount exceeds the predetermined threshold and to output a detection signal indicating a result of the detection.

20 Claims, 28 Drawing Sheets

(51) Int. Cl.
*H04N 25/77* (2023.01)
*H04N 25/633* (2023.01)

(58) Field of Classification Search
CPC .. H04N 5/374; H04N 5/361; H01L 27/14605; H01L 27/14609; H01L 27/14643
See application file for complete search history.

(56) References Cited

U.S. PATENT DOCUMENTS

| | | |
|---|---|---|
| 2016/0088245 A1* | 3/2016 | Nakata .............. H01L 27/14621 257/432 |
| 2016/0094796 A1 | 3/2016 | Govil |
| 2018/0146149 A1 | 5/2018 | Suh et al. |
| 2019/0379831 A1 | 12/2019 | Kaibara |
| 2022/0053154 A1 | 2/2022 | Kitano |

FOREIGN PATENT DOCUMENTS

| | | |
|---|---|---|
| JP | 2018-085725 | 5/2018 |
| WO | WO 2019/211949 | 11/2019 |

OTHER PUBLICATIONS

Official Action for U.S. Appl. No. 17/276,231, dated Dec. 15, 2021, 21 pages.
Notice of Allowance for U.S. Appl. No. 17/276,231, dated Jun. 29, 2022, 12 pages.

* cited by examiner

FIG.23
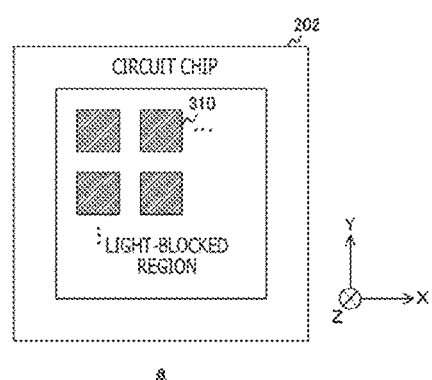
a
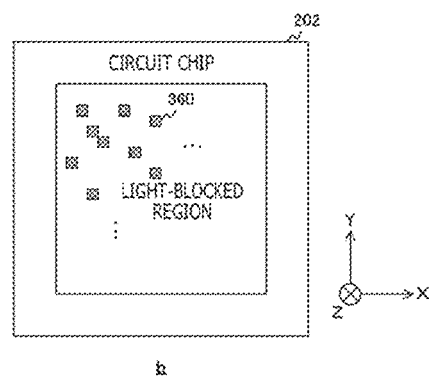
b

F I G . 2 4
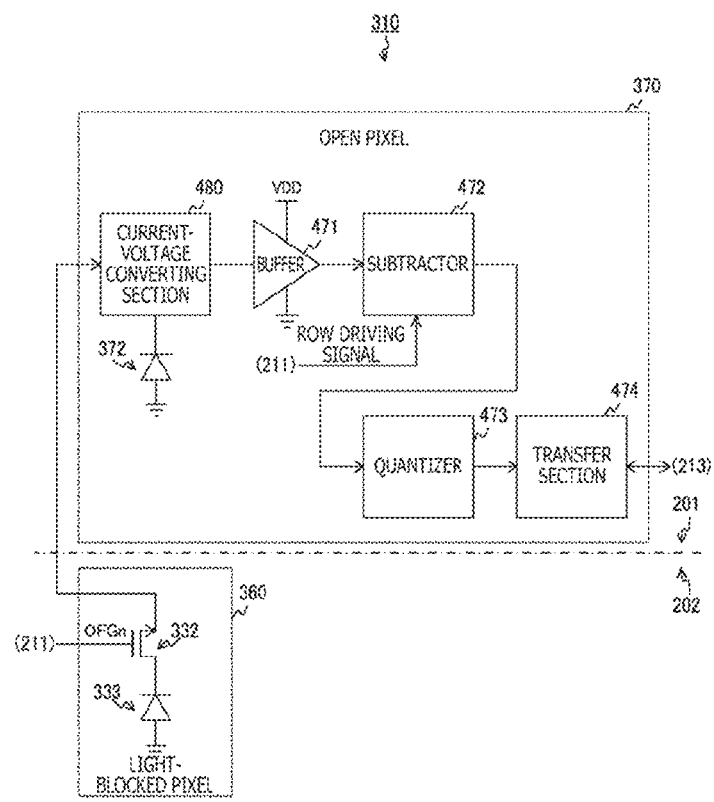

SOLID-STATE IMAGING ELEMENT AND IMAGING DEVICE

CROSS REFERENCE TO RELATED APPLICATIONS

This application is a continuation of U.S. patent application Ser. No. 17/276,231 filed Mar. 15, 2021 which is a national stage application under 35 U.S.C. 371 and claims the benefit of PCT Application No. PCT/JP2019/036623 having an international filing date of 18 Sep. 2019, which designated the United States, which PCT application claimed the benefit of Japanese Patent Application No. 2018-181151, filed 27 Sep. 2018, the entire disclosures of each of which are incorporated herein by reference.

DESCRIPTION

Technical Field

The present technology relates to a solid-state imaging element and an imaging device. Specifically, the present technology relates to a solid-state imaging element and an imaging device that compare incident light amounts to a threshold.

Background Art

Hitherto, synchronous solid-state imaging elements configured to capture image data (frames) in synchronization with synchronization signals such as vertical synchronization signals have been used in imaging devices and the like. Such a general synchronous solid-state imaging element can acquire image data only at intervals of a synchronization signal (for example, every 1/60 of a second). This makes it difficult to respond to cases requiring faster processing in fields related to traffic, robotics, and so on. For this reason, an asynchronous solid-state imaging element has been proposed that includes, in each pixel, a detection circuit configured to detect, as an address event, the fact that the amount of change in light amount in the pixel exceeds a threshold on a real time basis for each pixel address (for example, see PTL 1). Solid-state imaging elements configured to detect address events in each pixel in this way are called a "DVS (Dynamic Vision Sensor)."

CITATION LIST

Patent Literature

[PTL 1]
 JP-T-2017-535999

SUMMARY

Technical Problems

The asynchronous solid-state imaging element (that is, DVS), which is described above, generates and outputs data at a significantly higher speed than that of synchronous solid-state imaging elements. Thus, for example, in the traffic field, the process of identifying people or objects through image recognition is executed at high speed. However, in the pixel, the photodiode sometimes outputs a current called a "dark current" even when not receiving light, and this dark current causes dark current noise. Further, in the pixel, in a circuit in a stage following the photodiode, a constant offset voltage is sometimes generated due to, for example, a difference in characteristic of the transistors of the differential pair, and this offset voltage causes offset noise. The above-mentioned solid-state imaging element has a problem in that the signal quality of signals generated by the pixels drops due to those dark current noise and offset noise.

The present technology has been made in view of such circumstances and has an object to enhance the signal quality of a solid-state imaging element configured to detect address events.

Solution to Problems

The present technology has been made to solve the above-mentioned problem, and according to a first aspect thereof, there is provided a solid-state imaging element including open pixels each configured to detect whether or not an amount of change in incident light amount exceeds a predetermined threshold and to output a detection signal indicating a result of the detection, and light-blocked pixels each configured to output a correction signal based on an amount of noise generated in the open pixels. This provides an effect that correction signals based on the amounts of noise generated in the open pixels are generated.

Further, in this first aspect, the open pixels and the light-blocked pixels may be arrayed on a predetermined plane. This provides an effect that correction signals are generated by the light-blocked pixels arrayed on the same plane as the open pixels.

Further, in this first aspect, the open pixels may be arrayed on one of a pair of planes facing each other, and the light-blocked pixels may be arrayed on the other of the pair of planes. This provides an effect that the area of the region in which the open pixels are arrayed is increased.

Further, in this first aspect, the light-blocked pixels and the open pixels may be disposed on a one-to-one basis. This provides an effect that a correction signal is generated for each open pixel.

Further, in this first aspect, on the other of the pair of planes, multiple light-blocked pixel blocks each including a predetermined number of the light-blocked pixels may be arrayed, and the multiple light-blocked pixel blocks may be arrayed to be away from each other at certain intervals. This provides an effect that a correction signal is generated for each light-blocked pixel block.

Further, in this first aspect, the light-blocked pixels may be irregularly disposed. This provides an effect that correction signals are generated by the light-blocked pixels disposed irregularly.

Further, in this first aspect, the solid-state imaging element may further include a signal processing section configured to perform, according to the correction signal, correction processing of removing the noise from a pixel signal based on the light amount, in which the open pixels may each further output the pixel signal. This provides an effect that noise is removed from pixel signals.

Further, in this first aspect, the light-blocked pixels may each include a photoelectric conversion element, a current-voltage converting section configured to convert a dark current generated in the photoelectric conversion element to a voltage signal, a quantizer configured to detect whether or not an amount of change in the voltage signal exceeds the threshold, and a pixel signal generating section configured to generate a pixel signal based on the light amount as the correction signal. This provides an effect that detection signals and pixel signals are generated by the light-blocked pixels.

Further, in this first aspect, the current-voltage converting section may convert the dark current to the voltage signal with loop circuits in a plurality of stages. This provides an effect that the conversion gain is increased.

Further, in this first aspect, the photoelectric conversion element and a part of the pixel signal generating section may be disposed on a predetermined light receiving chip, and a remaining part of the pixel signal generating section, the current-voltage converting section, and the quantizer may be disposed on a predetermined circuit chip. This provides an effect that the circuit scale of the circuit chip is reduced.

Further, in this first aspect, the photoelectric conversion element, a part of the pixel signal generating section, and a part of the current-voltage converting section may be disposed on a predetermined light receiving chip, and a remaining part of the pixel signal generating section, a remaining part of the current-voltage converting section, and the quantizer may be disposed on a predetermined circuit chip. This provides an effect that the circuit scale of the circuit chip is reduced.

Further, in this first aspect, the photoelectric conversion element, the pixel signal generating section, and a part of the current-voltage converting section may be disposed on a predetermined light receiving chip, and a remaining part of the current-voltage converting section and the quantizer may be disposed on a predetermined circuit chip. This provides an effect that the circuit scale of the circuit chip is reduced.

Further, in this first aspect, the light-blocked pixels may each further include a selector configured to select and output either a predetermined test signal or the voltage signal as a selection signal, and the quantizer may detect whether or not an amount of change in the selection signal exceeds the threshold. This provides an effect that pixel signals are output irrespective of the presence or absence of address events.

Further, in this first aspect, the open pixels may each include a photoelectric conversion element configured to generate a photocurrent by photoelectric conversion, a current-voltage converting section configured to convert a difference between the photocurrent and a dark current to a voltage signal, and a quantizer configured to detect whether or not an amount of change in the voltage signal exceeds the threshold. The light-blocked pixels may each output the dark current as the correction signal. This provides an effect that dark current noise is prevented.

Further, in this first aspect, the solid-state imaging element may further include a threshold adjusting section configured to adjust the threshold based on the correction signal. This provides an effect that the detection accuracy of address events is enhanced.

Further, according to a second aspect of the present technology, there is provided an imaging device including open pixels each configured to detect whether or not an amount of change in incident light amount exceeds a predetermined threshold and to indicate a result of the detection, light-blocked pixels each configured to output a correction signal based on an amount of noise generated in the open pixels, and a signal processing section configured to process the detection signal. This provides an effect that correction signals for correcting noise generated in the open pixels are generated and that detection signals are processed.

BRIEF DESCRIPTION OF DRAWINGS

FIG. 23 represents examples of plan views of the circuit chip according to the third embodiment of the present technology.

FIG. 24 is a block diagram illustrating configuration examples of an open pixel and a light-blocked pixel according to the third embodiment of the present technology.

DESCRIPTION OF EMBODIMENTS

Now, modes for carrying out the present technology (hereinafter referred to as "embodiments") are described. The following items are described in order.

1. First embodiment (an example in which light-blocked pixels and open pixels are arrayed on the same plane)
2. Second embodiment (an example in which the light-blocked pixels and the open pixels are arrayed and loop circuits in two stages are provided)
3. Third embodiment (an example in which the light-blocked pixels and the open pixels are arrayed on different planes)
4. Fourth embodiment (an example in which the light-blocked pixels and the open pixels are arrayed and a threshold is adjusted)
5. Fifth embodiment (scan type)
6. Application example to mobile body 1. First Embodiment

[Configuration Example of Imaging Device]

Figure 1:
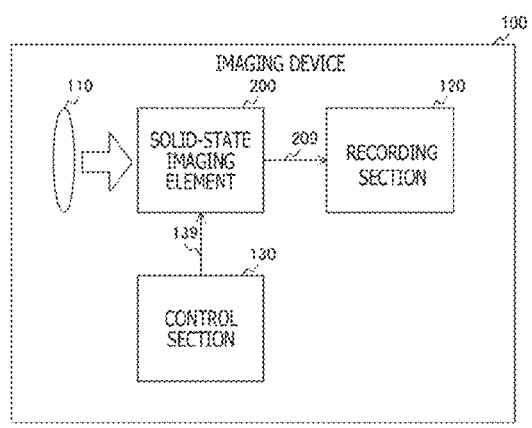
FIG. 1 is a block diagram illustrating a configuration example of an imaging device according to a first embodiment of the present technology.

FIG. 1 is a block diagram illustrating a configuration example of an imaging device 100 according to a first embodiment of the present technology. The imaging device 100 includes an imaging lens 110, a solid-state imaging element 200, a recording section 120, and a control section 130. As the imaging device 100, a camera that is installed on an industrial robot or a vehicle-mounted camera is assumed.

The imaging lens 110 collects incident light and guides the incident light to the solid-state imaging element 200. The solid-state imaging element 200 performs photoelectric conversion on incident light to capture image data. The solid-state imaging element 200 executes, on the captured image data, predetermined signal processing such as image recognition processing and outputs data indicating the results of the processing and address event detection signals to the recording section 120 through a signal line 209. The detection signal generation method is described later.

The recording section 120 records data from the solid-state imaging element 200. The control section 130 controls the solid-state imaging element 200 to capture image data.

[Configuration Example of Solid-State Imaging Element]

Figure 2:
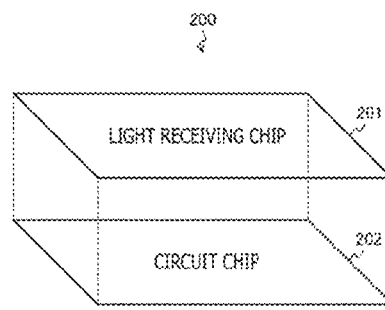
FIG. 2 is a diagram illustrating an example of the stacked structure of a solid-state imaging element according to the first embodiment of the present technology.

FIG. 2 is a diagram illustrating an example of the stacked structure of the solid-state imaging element 200 according to the first embodiment of the present technology. The solid-state imaging element 200 includes a circuit chip 202 and a light receiving chip 201 stacked on the circuit chip 202. These chips are electrically connected to each other through connection portions such as vias. Note that the chips can also be connected to each other through Cu—Cu connection or bumps instead of the vias.

Figure 3:
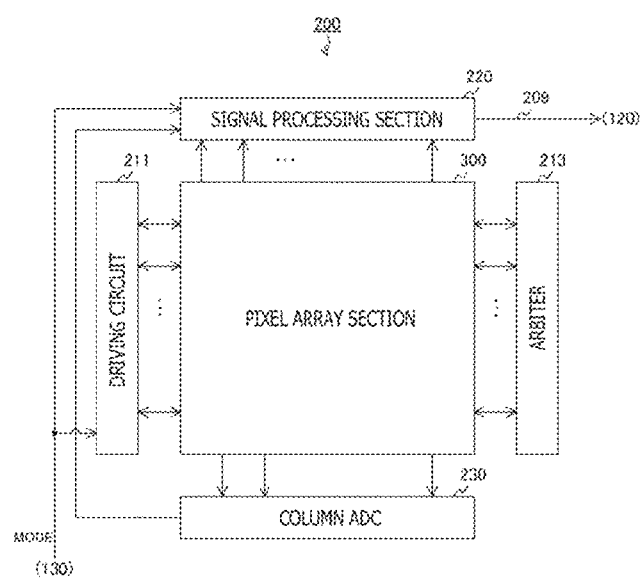
FIG. 3 is a block diagram illustrating a configuration example of the solid-state imaging element according to the first embodiment of the present technology.

FIG. 3 is a block diagram illustrating a configuration example of the solid-state imaging element 200 according to the first embodiment of the present technology. The solid-state imaging element 200 includes a driving circuit 211, a signal processing section 220, an arbiter 213, a column ADC 230, and a pixel array section 300.

In the pixel array section 300, a plurality of pixels is arrayed in a two-dimensional lattice pattern. Further, the pixel array section 300 is divided into multiple pixel blocks each including a predetermined number of pixels. In the following, a collection of pixels or pixel blocks arrayed in the horizontal direction is referred to as a "row," and a collection of pixels or pixel blocks arrayed in a direction vertical to the row is referred to as a "column."

Each pixel generates an analog signal having a voltage based on a photocurrent, as a pixel signal. Further, each pixel block detects the presence or absence of an address event on the basis of whether or not the amount of change in photocurrent exceeds a predetermined threshold. Then, a pixel block in which an address event has occurred outputs a request to the arbiter.

The driving circuit 211 drives each pixel such that the pixels output pixel signals to the column ADC 230.

The arbiter 213 arbitrates between requests from the respective pixel blocks and transmits responses to the pixel blocks on the basis of the arbitration result. The pixel blocks that have received the responses supply detection signals indicating detection results to the driving circuit 211 and the signal processing section 220.

The column ADC 230 converts analog pixel signals from each column of the pixel blocks, to digital signals. The column ADC 230 supplies the digital signals to the signal processing section 220.

The signal processing section 220 executes, on digital signals from the column ADC 230, predetermined signal processing such as CDS (Correlated Double Sampling) processing, noise correction processing, or image recognition processing. The signal processing section 220 supplies data indicating the processing results and detection signals to the recording section 120 through the signal line 209.

Further, the driving circuit 211 and the signal processing section 220 receive a mode signal MODE generated by the control section 130. The mode signal MODE is a signal for setting any of a plurality of modes including a calibration mode and an imaging mode. Here, the calibration mode is a mode for obtaining correction values for correcting dark current noise and offset noise. On the other hand, the imaging mode is a mode for capturing image data. The calibration mode is executed when a predetermined event occurs, for example, when the imaging device 100 is powered on, or executed at regular intervals, for example.

[Configuration Example of Pixel Array Section]

Figure 4:
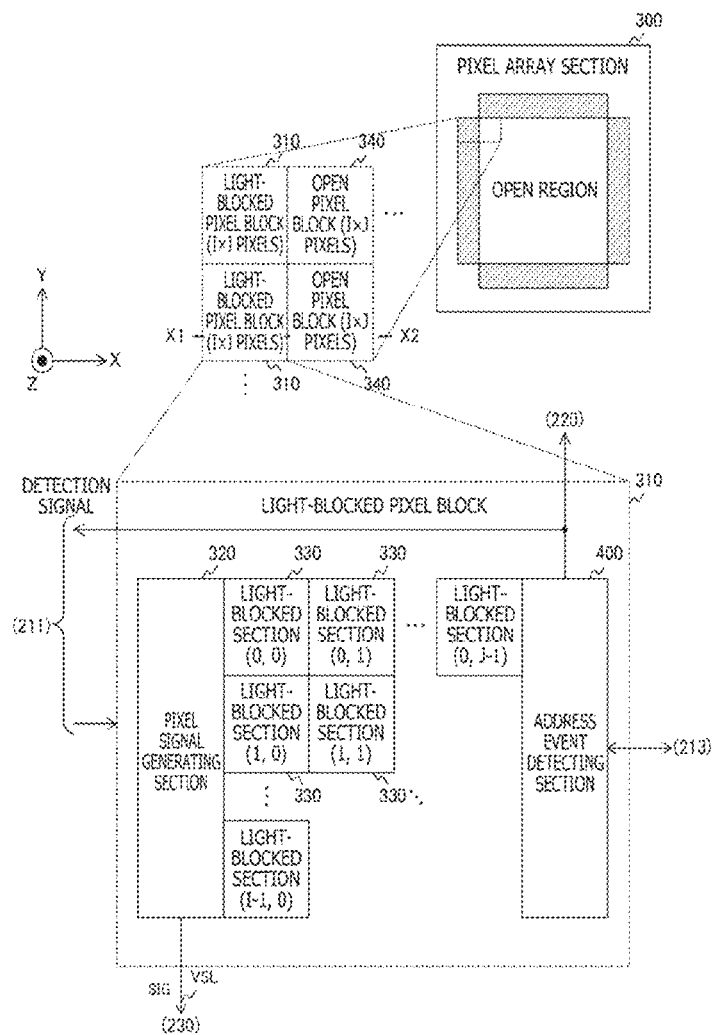
FIG. 4 is a block diagram illustrating a configuration example of a pixel array section according to the first embodiment of the present technology.

FIG. 4 is a block diagram illustrating a configuration example of the pixel array section 300 according to the first embodiment of the present technology. The pixel array section 300 has, on its light receiving surface, an open region that is exposed to light, and a light-blocked region that is not exposed to light. The shaded portion in FIG. 4 represents the light-blocked region. The light-blocked region is disposed around the open region, for example. Further, a predetermined direction parallel to the light receiving surface of the pixel array section 300 is an X direction, and a direction vertical to the light receiving surface is a Z direction. A direction vertical to the X direction and the Z direction is a Y direction.

The light-blocked region and the open region are divided into multiple pixel blocks. Each pixel block in the light-blocked region is a light-blocked pixel block 310, and each pixel block in the open region is an open pixel block 340. In each of the light-blocked pixel blocks 310, a plurality of light-blocked pixels is arrayed in I rows and J columns (I and J are integers). Further, in each of the open pixel blocks 340, a plurality of open pixels is arrayed in I rows and J columns.

The light-blocked pixel block 310 includes a pixel signal generating section 320, a plurality of light-blocked sections 330 in I rows and J columns, and an address event detecting section 400. The plurality of light-blocked sections 330 in the light-blocked pixel block 310 shares the pixel signal generating section 320 and the address event detecting section 400. Further, a circuit including the light-blocked section 330 at certain coordinates, the pixel signal generating section 320, and the address event detecting section 400 functions as a light-blocked pixel at the coordinates in question. Further, a vertical signal line VSL is wired in each column of the light-blocked pixel block 310.

The light-blocked section 330 outputs a dark current generated in its photoelectric conversion element. The light-blocked section 330 supplies the dark current to either the pixel signal generating section 320 or the address event detecting section 400, under the control of the driving circuit 211.

The pixel signal generating section 320 generates a signal having a voltage based on a dark current, as a pixel signal SIG. The pixel signal generating section 320 supplies the generated pixel signal SIG to the column ADC 230 through the vertical signal line VSL.

The address event detecting section 400 detects the presence or absence of an address event on the basis of whether or not the amount of change in dark current from each of the light-blocked sections 330 exceeds the predetermined threshold. Examples of address events include on-events indicating that the amount of change exceeds an upper limit threshold, and off-events indicating that the amount of change falls below a lower limit threshold. Further, examples of address event detection signals include 1 bit indicating on-event detection results, and 1 bit indicating off-event detection results. Note that the address event detecting section 400 can also detect only on-events.

When an address event has occurred, the address event detecting section 400 supplies, to the arbiter 213, a request for requesting detection signal transmission. Then, when receiving a response to the request from the arbiter 213, the address event detecting section 400 supplies a detection signal to the driving circuit 211 and the signal processing section 220.

Figure 5:
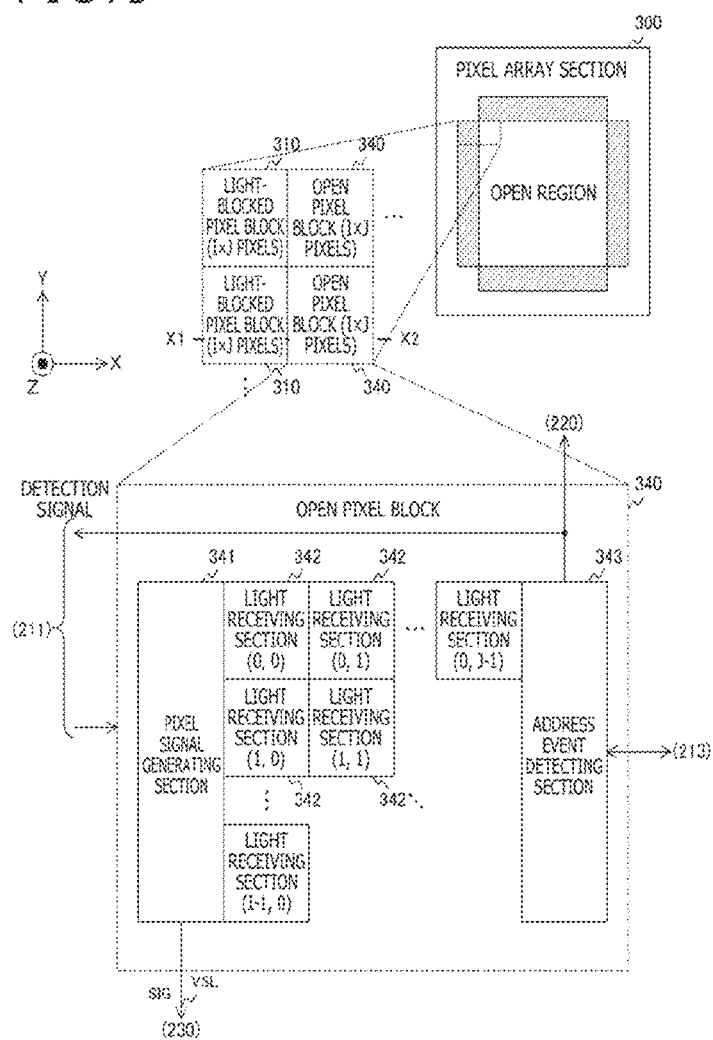
FIG. 5 is a block diagram illustrating a configuration example of an open pixel block according to the first embodiment of the present technology.

FIG. 5 is a block diagram illustrating a configuration example of the open pixel block 340 according to the first embodiment of the present technology. The open pixel block 340 includes a pixel signal generating section 341, a plurality of light receiving sections 342 in I rows and J columns, and an address event detecting section 343. The plurality of light receiving sections 342 in the open pixel block 340 shares the pixel signal generating section 341 and the address event detecting section 343. Further, a circuit including the light receiving section 342 at certain coordinates, the pixel signal generating section 341, and the address event detecting section 343 functions as an open pixel at the coordinates in question. Further, the vertical signal line VSL is wired in each column of the open pixel block 340.

The light receiving section 342 generates a photocurrent through photoelectric conversion and outputs the photocurrent. The pixel signal generating section 341 and the address event detecting section 343 are configured similarly to the corresponding circuits in the light-blocked pixel block 310.

[Configuration Example of Light-Blocked Pixel Block]

Figure 6:
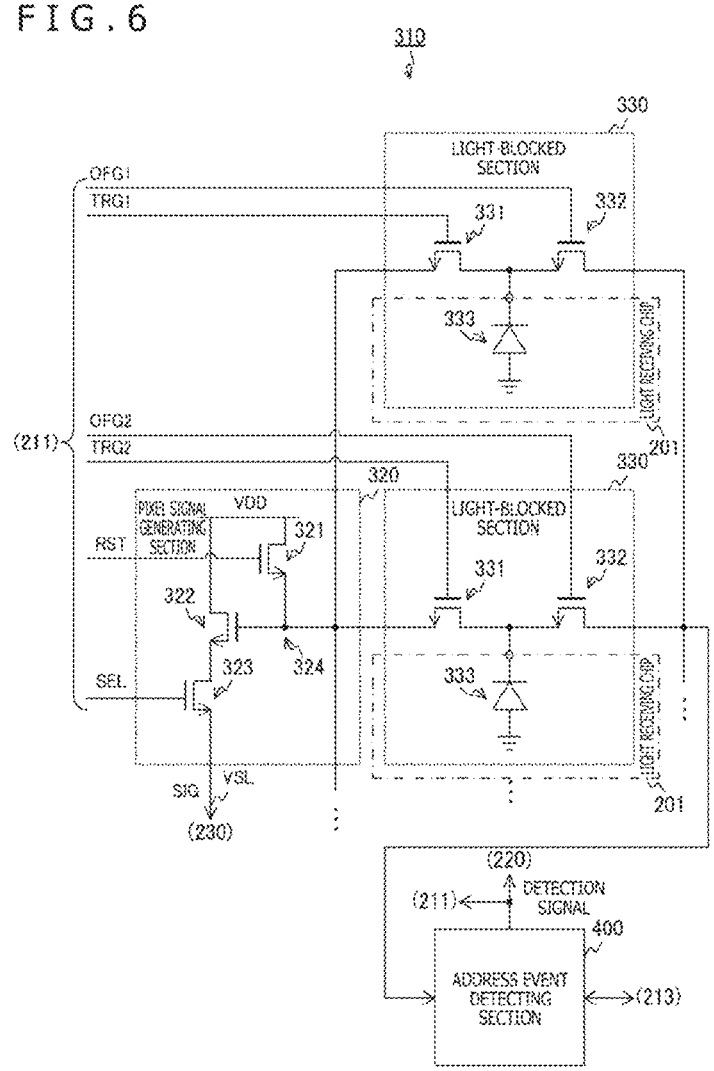
FIG. 6 is a circuit diagram illustrating configuration examples of a pixel signal generating section and light-blocked sections according to the first embodiment of the present technology.

FIG. 6 is a circuit diagram illustrating a configuration example of the light-blocked pixel block 310 according to the first embodiment of the present technology. In the light-blocked pixel block 310, the pixel signal generating section 320 includes a reset transistor 321, an amplification transistor 322, a selection transistor 323, and a floating diffusion layer 324. The plurality of light-blocked sections 330 is connected to the address event detecting section 400 in common through predetermined connection nodes.

Further, the light-blocked sections 330 each include a transfer transistor 331, an OFG (OverFlow Gate) transistor 332, and a photoelectric conversion element 333. When the number of pixels in the light-blocked pixel block 310 is N (N is an integer), the number of each of the transfer transistors 331, the OFG transistors 332, and the photoelectric conversion elements 333 is N. The n-th (n is an integer of 1 to N) transfer transistor 331 in the light-blocked pixel block 310 receives a transfer signal TRGn supplied from the driving circuit 211. The n-th OFG transistor 332 receives a control signal OFGn supplied from the driving circuit 211.

Further, as the reset transistor 321, the amplification transistor 322, and the selection transistor 323, for example, N-type MOS (Metal-Oxide-Semiconductor) transistors are used. Similarly, as the transfer transistors 331 and the OFG transistors 332, N-type MOS transistors are used.

Further, the photoelectric conversion elements 333 are each disposed on the light receiving chip 201. All the elements other than the photoelectric conversion elements 333 are disposed on the circuit chip 202.

The photoelectric conversion element 333 performs photoelectric conversion on incident light to generate charges. However, since the light-blocked section 330 is not exposed to light, a dark current is generated in the photoelectric conversion element 333. The transfer transistor 331 transfers, according to the transfer signal TRGn, charges from the corresponding photoelectric conversion element 333 to the floating diffusion layer 324. The OFG transistor 332 supplies, according to the control signal OFGn, a dark current generated in the corresponding photoelectric conversion element 333 to the connection node.

The floating diffusion layer 324 accumulates charges and generates a voltage based on the amount of the accumulated charges. The reset transistor 321 initializes the amount of charges in the floating diffusion layer 324 according to a reset signal RST from the driving circuit 211. The amplification transistor 322 amplifies the voltage of the floating diffusion layer 324. The selection transistor 323 outputs, according to a selection signal SEL from the driving circuit 211, a signal having an amplified voltage to the column ADC 230 as the pixel signal SIG through the vertical signal line VSL.

Note that the circuit configuration of the open pixel block 340 is similar to that of the light-blocked pixel block 310 exemplified in FIG. 6.

In the calibration mode, the driving circuit 211 sequentially drives, irrespective of the presence or absence of an address event in the light-blocked pixel block 310, the light-blocked pixels with the transfer signal TRGn such that the light-blocked pixels transfer charges to the floating diffusion layer 324. With this, respective pixel signals of the plurality of light-blocked pixels in the open pixel block 340 are sequentially output. The pixel signals are signals based on the amounts of dark current noise and offset noise generated in the open pixels and are used as correction signals for correcting the noise.

On the other hand, in the imaging mode, the driving circuit 211 drives all the open pixels with the control signal OFGn such that the open pixels detect whether or not the amounts of change in incident light amount exceeds the threshold (that is, the presence or absence of address events) in units of the open pixel blocks 340.

Then, when an address event has been detected in a certain open pixel block 340, the driving circuit 211 sequentially drives all the open pixels of the block in question such that the open pixels generate pixel signals based on the light amounts. Then, the signal processing section 220 performs, on the basis of pixel signals of the light-blocked pixels (correction signals), correction processing of removing noise from the pixel signals of the open pixels.

In this way, the solid-state imaging element 200 outputs, to the column ADC 230, only pixel signals of the open pixel block 340 in which an address event has been detected. With this, the power consumption of the solid-state imaging element 200 and the processing amount of image processing can be reduced as compared to a case where pixel signals of all open pixels are output irrespective of the presence or absence of address events.

Further, the plurality of open pixels shares the address event detecting section 400, so that the circuit scale of the solid-state imaging element 200 can be reduced as compared to a case where the address event detecting section 400 is disposed for each open pixel.

In addition, the signal processing section 220 uses pixel signals of the light-blocked pixels as correction signals, so that dark current noise and offset noise generated in the open pixels can be removed.

Figure 7:
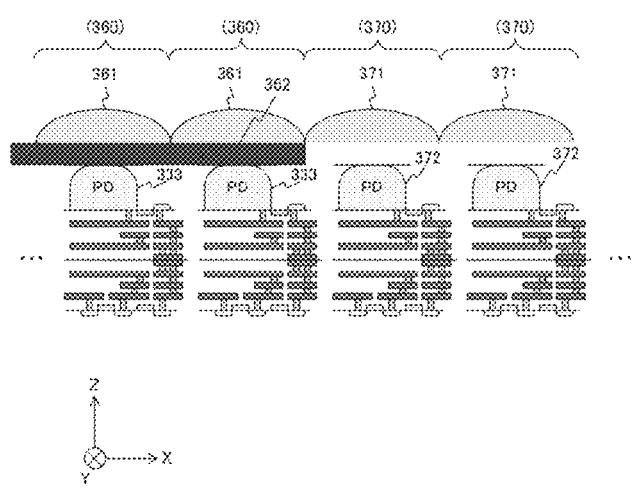
FIG. 7 is an example of a sectional view of the solid-state imaging element according to the first embodiment of the present technology.

FIG. 7 is an example of a sectional view of the solid-state imaging element 200 according to the first embodiment of the present technology. FIG. 7 is a sectional view taken along a plane vertical to the line segment X1 to X2 of FIG. 4. On the light receiving surface, light-blocked pixels 360 and open pixels 370 are arrayed.

An on-chip microlens 361 and the photoelectric conversion element 333 are disposed in each of the light-blocked pixels 360. Further, in the light-blocked region, a light-blocking member 362 is disposed between the on-chip microlenses 361 and the photoelectric conversion elements 333.

Meanwhile, an on-chip microlens 371 and a photoelectric conversion element 372 are disposed in each of the open pixels 370.

Note that, although the photoelectric conversion element 333 is disposed in the light-blocked pixel 360, a constant current source configured to supply a dark current generated in the photoelectric conversion element 372 in the open pixel 370 can also be disposed instead of the photoelectric conversion element 333.

As exemplified in FIG. 7, both the light-blocked pixel 360 and the open pixel 370 are arrayed on the light receiving surface of the light receiving chip 201.

[Configuration Example of Address Event Detecting Section]

Figure 8:
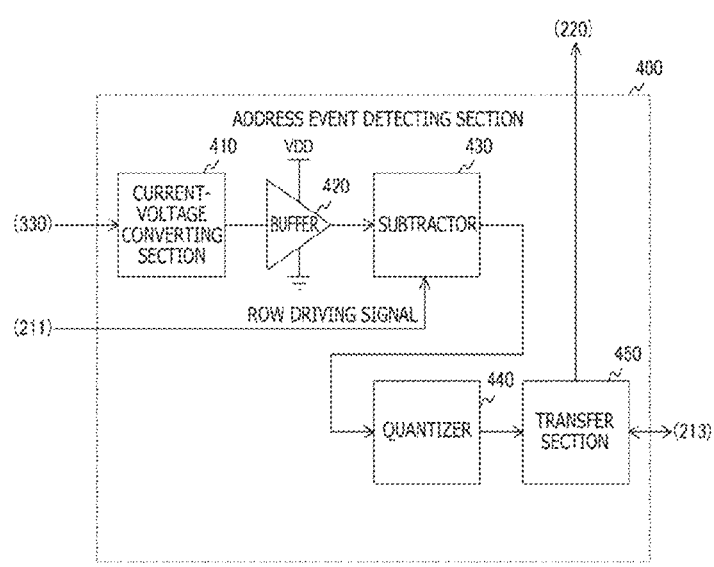
FIG. 8 is a block diagram illustrating a configuration example of an address event detecting section according to the first embodiment of the present technology.

FIG. 8 is a block diagram illustrating a configuration example of the address event detecting section 400 according to the first embodiment of the present technology. The address event detecting section 400 includes a current-voltage converting section 410, a buffer 420, a subtractor 430, a quantizer 440, and a transfer section 450.

The current-voltage converting section 410 converts current signals from the corresponding light-blocked sections 330 to voltage signals corresponding to the logarithms thereof. The current-voltage converting section 410 supplies the voltage signals to the buffer 420.

The buffer 420 outputs voltage signals from the current-voltage converting section 410 to the subtractor 430. With the buffer 420, driving force for driving the following stages can be can increased. Further, with the buffer 420, the isolation of noise due to the switching operation of the following stages can be achieved.

The subtractor 430 lowers, according to a row driving signal from the driving circuit 211, the levels of voltage signals from the buffer 420. The subtractor 430 supplies the voltage signals at the lowered levels to the quantizer 440.

The quantizer 440 quantizes voltage signals from the subtractor 430 to digital signals and outputs the digital signals to the transfer section 450 as detection signals.

The transfer section 450 transfers detection signals from the quantizer 440 to the signal processing section 220 and the like. When an address event has been detected, the transfer section 450 supplies, to the arbiter 213, a request for requesting detection signal transmission. Then, when receiving a response to the request from the arbiter 213, the transfer section 450 supplies a detection signal to the driving circuit 211 and the signal processing section 220.

[Configuration Example of Current-Voltage Converting Section]

Figure 9:
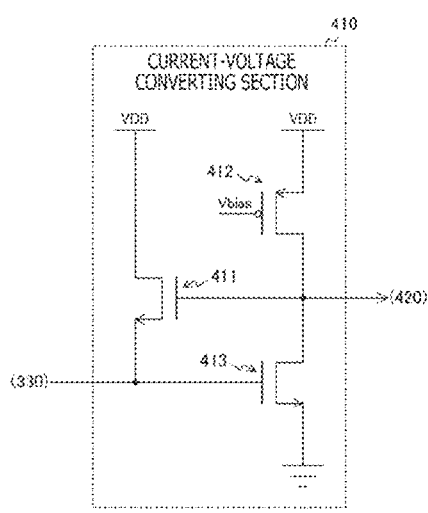
FIG. 9 is a circuit diagram illustrating a configuration example of a current-voltage converting section according to the first embodiment of the present technology.

FIG. 9 is a circuit diagram illustrating a configuration example of the current-voltage converting section 410 according to the first embodiment of the present technology. The current-voltage converting section 410 includes N-type transistors 411 and 413 and a P-type transistor 412. As these transistors, for example, MOS transistors are used.

The N-type transistor 411 has a source connected to the light-blocked sections 330 and a drain connected to a power supply terminal. The P-type transistor 412 is connected to the N-type transistor 413 in series between the power supply terminal and a ground terminal. Further, the connection node between the P-type transistor 412 and the N-type transistor 413 is connected to the gate of the N-type transistor 411 and the input terminal of the buffer 420. Further, a predetermined bias voltage Vbias is applied to the gate of the P-type transistor 412.

The drains of the N-type transistors 411 and 413 are connected on the power supply side. Such circuits are called "source followers." The two connected source followers, which forms a loop, convert currents from the light-blocked sections 330 to voltage signals corresponding to the logarithms thereof. Further, the P-type transistor 412 supplies a constant current to the N-type transistor 413.

[Configuration Examples of Subtractor and Quantizer]

Figure 10:
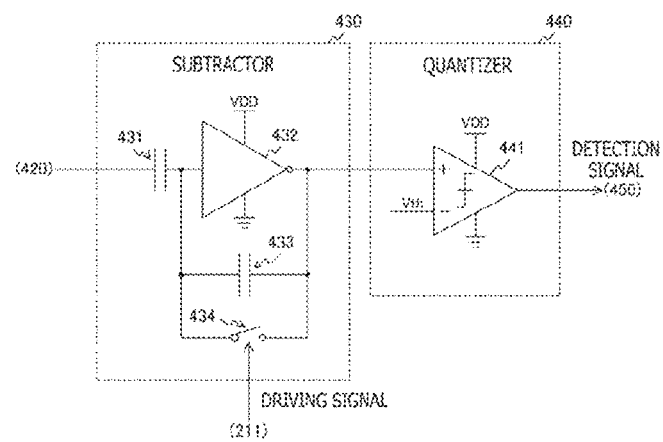
FIG. 10 is a circuit diagram illustrating configuration examples of a subtractor and a quantizer according to the first embodiment of the present technology.

FIG. 10 is a circuit diagram illustrating configuration examples of the subtractor 430 and the quantizer 440 according to the first embodiment of the present technology.

The subtractor 430 includes capacitors 431 and 433, an inverter 432, and a switch 434. Further, the quantizer 440 includes a comparator 441.

The capacitor 431 has one end connected to the output terminal of the buffer 420 and the other end connected to the input terminal of the inverter 432. The capacitor 433 is connected to the inverter 432 in parallel. The switch 434 opens and closes the path connecting both ends of the capacitor 433 to each other, according to driving signals.

The inverter 432 inverts voltage signals input through the capacitor 431. The inverter 432 outputs the inverted signals to the non-inverting input terminal (+) of the comparator 441.

When the switch 434 is turned on, a voltage signal $V_{init}$ is input on the buffer 420 side of the capacitor 431, and the other side serves as a virtual ground terminal. The potential of the virtual ground terminal is regarded as zero, as a matter of convenience. Here, a potential $Q_{init}$ that is accumulated in the capacitor 431 is expressed by the following expression where C1 denotes the capacitance of the capacitor 431. Meanwhile, both the ends of the capacitor 433 are short-circuited, so that no charge is accumulated in the capacitor 433.

$$Q_{init} = C1 \times V_{init} \qquad \text{Expression 1}$$

Next, a case where the switch 434 is turned off and the voltage on the buffer 420 side of the capacitor 431 changes to $V_{after}$ is considered. A charge $Q_{after}$ that is accumulated in the capacitor 431 is expressed by the following expression.

$$Q_{after} = C1 \times V_{after} \qquad \text{Expression 2}$$

Meanwhile, a charge Q2 that is accumulated in the capacitor 433 is expressed by the following expression where $V_{out}$ denotes the output voltage.

$$Q2 = -C2 \times V_{out} \qquad \text{Expression 3}$$

Here, since the total amount of charges in the capacitors 431 and 433 does not change, the following expression is established.

$$Q_{init} = Q_{after} + Q2 \qquad \text{Expression 4}$$

When Expression 1 to Expression 3 are substituted for Expression 4 to be transformed, the following expression is obtained.

$$V_{out} = -(C1/C2) \times (V_{after} - V_{init}) \qquad \text{Expression 5}$$

Expression 5 expresses the subtraction operation of a voltage signal, and the gain of the subtraction result is C1/C2. Since the maximum gain is desired in general, C1 is preferably set to a large value, and C2 is preferably set to a small value. However, when C2 is extremely small, kTC noise increases, possibly resulting in that the noise characteristics deteriorate. Thus, the capacitance C2 can only be reduced in a range that achieves acceptable noise. Further, since the address event detecting section 400 including the subtractor 430 is provided in each pixel block, the capacitances C1 and C2 have space constraints. In consideration of these matters, the values of the capacitances C1 and C2 are determined.

The comparator 441 compares voltage signals from the subtractor 430 to a threshold voltage Vth that is applied to the inverting input terminal (−) and that indicates a predetermined threshold. The comparator 441 outputs signals indicating the comparison results to the transfer section 450 as detection signals.

Further, a gain A of the entire address event detecting section 400 described above is expressed by the following expression where $CG_{log}$ denotes the conversion gain of the current-voltage converting section 410 and where the gain of the buffer 420 is "1."

[Math. 1]

$$A = \frac{CG_{log} \cdot C1}{C2} \sum_{n=1}^{N} i_{photo\_n} \qquad \text{Expression 6}$$

In the above-mentioned expression, $i_{photo\_n}$ denotes a photocurrent of an n-th pixel in units of ampere (A), for example. N denotes the number of pixels in the pixel blocks (light-blocked pixel blocks 310 and open pixel blocks 340).

[Configuration Example of Column ADC]

Figure 11:
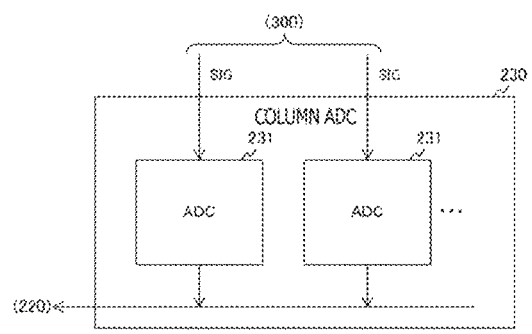
FIG. 11 is a block diagram illustrating a configuration example of a column ADC according to the first embodiment of the present technology.

FIG. 11 is a block diagram illustrating a configuration example of the column ADC 230 according to the first embodiment of the present technology. The column ADC 230 includes an ADC 231 in each column of the pixel blocks (light-blocked pixel blocks 310 and open pixel blocks 340).

The ADC 231 converts the analog pixel signal SIG supplied through the vertical signal line VSL, to a digital signal. The pixel signal SIG is converted to a digital signal having more bits than that included in a detection signal. For example, when a detection signal has 2 bits, a pixel signal is converted to a digital signal having 3 bits or more (for example, 16 bits). The ADC 231 supplies the generated digital signal to the signal processing section 220.

[Operation Example of Solid-State Imaging Element]

Figure 12:
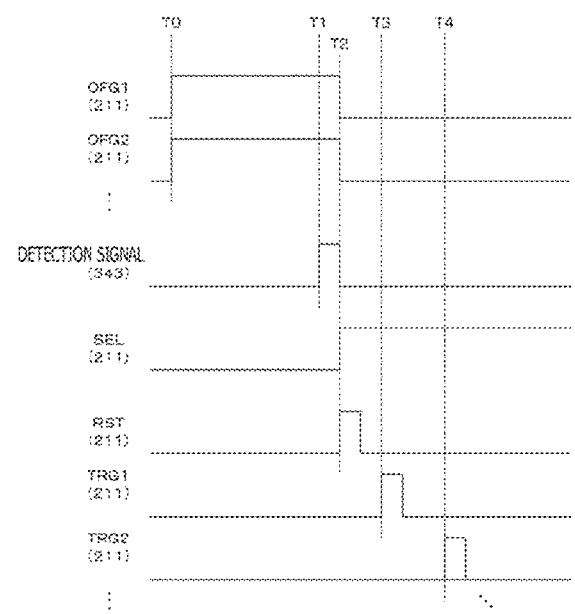
FIG. 12 is a timing chart illustrating an example of the operation of the solid-state imaging element according to the first embodiment of the present technology.

FIG. 12 is a timing chart illustrating an example of the operation of the solid-state imaging element 200 according to the first embodiment of the present technology. It is assumed that, at timing T0, the control section 130 sets the imaging mode. The driving circuit 211 sets all the control signals OFGn to the high level to turn on the OFG transistors of all the open pixels. With this, the sum of photocurrents of all the open pixels is supplied to the address event detecting section 343. Meanwhile, all the transfer signals TRGn are at the low level, and the transfer transistors of all the open pixels are thus in the off state.

Then, it is assumed that, at timing T1, the address event detecting section 343 detects an address event and outputs a detection signal at the high level. Here, the detection signal is assumed to be a 1-bit signal indicating that an on-event has been detected.

When receiving the detection signal, at timing T2, the driving circuit 211 sets all the control signals OFGn to the low level to stop the supply of the photocurrents to the address event detecting section 343. Further, the driving circuit 211 sets the selection signal SEL to the high level and sets the reset signal RST to the high level over a certain pulse period, thereby initializing the floating diffusion layer. The pixel signal generating section 341 outputs, as a reset level, the voltage in the initialization, and the ADC 231 converts the reset level to a digital signal.

At timing T3 after the reset level conversion, the driving circuit 211 supplies a transfer signal TRG1 at the high level over a certain pulse period to control the first pixel to output the voltage as a signal level. The ADC 231 converts the signal level to a digital signal. The signal processing section 220 obtains a difference between the reset level and the signal level as a net pixel signal. This processing is called "CDS processing."

At timing T4 after the signal level conversion, the driving circuit 211 supplies a transfer signal TRG2 at the high level over a certain pulse period to control the second pixel to output a signal level. The signal processing section 220 obtains a difference between the reset level and the signal level as a net pixel signal. Similar processing is executed thereafter such that pixel signals of the respective open pixels in the open pixel block 340 are sequentially output.

When all the pixel signals are output, the driving circuit 211 sets all the control signals OFGn to the high level to turn on the OFG transistors of all the open pixels.

Note that, in the calibration mode, the driving circuit 211 drives, irrespective of the presence or absence of address events, all the light-blocked pixels such that the light-blocked pixels sequentially output pixel signals.

Figure 13:
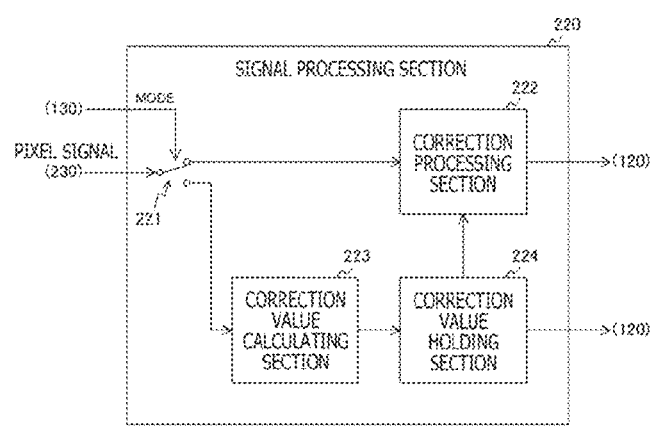
FIG. 13 is a block diagram illustrating a configuration example of a signal processing section according to the first embodiment of the present technology.

FIG. 13 is a block diagram illustrating a configuration example of the signal processing section 220 according to the first embodiment of the present technology. The signal processing section 220 includes a switch 221, a correction processing section 222, a correction value calculating section 223, and a correction value holding section 224.

The switch 221 switches, according to the mode signal MODE from the control section 130, destinations of pixel signals from the column ADC 230. In the case of the calibration mode, the switch 221 outputs pixel signals of the open pixels to the correction value calculating section 223. In the case of the imaging mode, the switch 221 outputs pixel signals of the light-blocked pixels to the correction processing section 222.

The correction value calculating section 223 calculates the statistic (average or total, for example) of pixel signals of the light-blocked pixels 360 to thereby calculate, for each open pixel, a correction value for noise correction. Then, the correction value calculating section 223 stores the calculated correction values in the correction value holding section 224. The correction value holding section 224 holds a correction value for each open pixel.

The correction processing section 222 corrects pixel signals of the open pixels 370 by using correction values. The correction processing section 222 performs, for example, correction processing of subtracting, from a pixel signal from the open pixel 370, a correction value corresponding to the pixel in question. With this correction processing, dark current noise and offset noise generated in the open pixel 370 are removed. The correction processing section 222 supplies the processed signal to the recording section 120. Further, the signal processing section 220 executes processing other than the correction processing, such as CDS processing or image recognition processing, as needed. The illustration of a circuit configured to perform the CDS processing or the like is omitted in FIG. 13.

Figure 14:
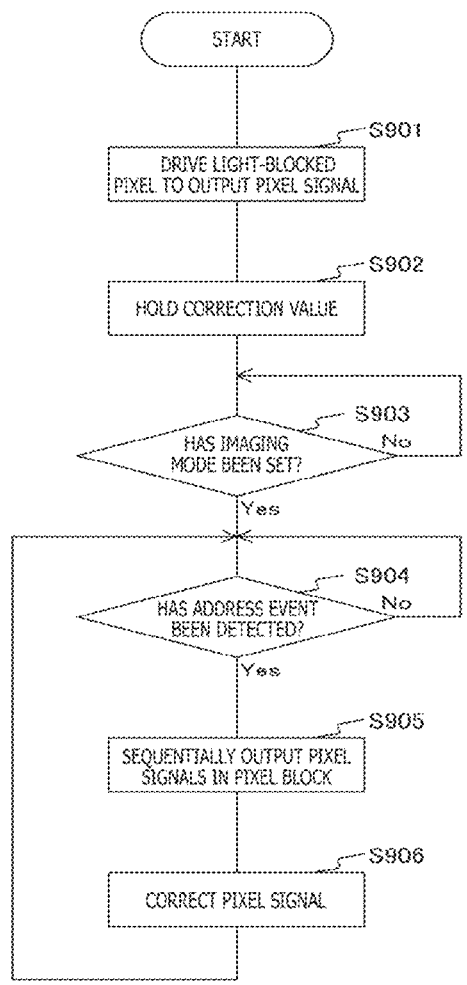
FIG. 14 is a flowchart illustrating an example of the operation of the solid-state imaging element according to the first embodiment of the present technology.

FIG. 14 is a flowchart illustrating an example of the operation of the solid-state imaging element 200 according to the first embodiment of the present technology. This operation starts when, for example, the calibration mode is set with the mode signal MODE.

The driving circuit 211 in the solid-state imaging element 200 drives each of the light-blocked pixels 360 such that the light-blocked pixels 360 output pixel signals (Step S901). Then, the signal processing section 220 calculates correction values on the basis of those pixel signals, and holds the correction values (Step S902).

The solid-state imaging element 200 determines whether or not the imaging mode has been set with the mode signal MODE (Step S903). In a case where the imaging mode has not been set (Step S903: No), the solid-state imaging element 200 repeats Step S903 and the subsequent steps.

On the other hand, in a case where the imaging mode has been set (Step S903: Yes), the driving circuit 211 determines whether or not an address event has occurred in any of the open pixel blocks 340 (Step S904). In a case where there is an address event (Step S904: Yes), the driving circuit 211 controls the respective pixels in the open pixel block 340 in which the address event has occurred, to sequentially output pixel signals (Step S905). Then, the signal processing section 220 corrects those pixel signals by using the correction values (Step S906).

In a case where there is no address event (Step S904: No) or after Step S906, the solid-state imaging element 200 repeatedly executes Step S904 and the subsequent steps.

In this way, according to the first embodiment of the present technology, the light-blocked pixels 360 output signals based on noise generated in the open pixels 370, so that the signal processing section 220 can remove the noise from pixel signals of the open pixels 370 by using the signals. With this, the signal quality of the pixel signals can be enhanced.

First Modified Example

In the first embodiment described above, the elements other than the photoelectric conversion elements 333 are disposed on the circuit chip 202. In this configuration, however, there is a possibility that the circuit chip 202 may have a larger circuit scale as the number of pixels is increased. The solid-state imaging element 200 according to a first modified example of the first embodiment is different from the first embodiment in that the circuit chip 202 has a reduced circuit scale.

Figure 15:
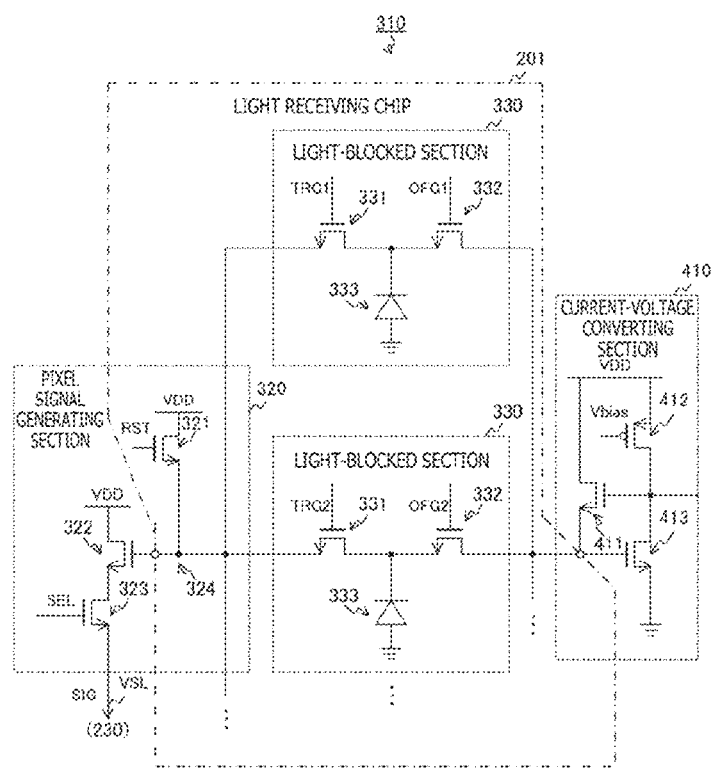
FIG. 15 is a circuit diagram illustrating a configuration example of a light-blocked pixel block according to a first modified example of the first embodiment of the present technology.

FIG. 15 is a circuit diagram illustrating a configuration example of the light-blocked pixel block 310 according to the first modified example of the first embodiment of the present technology. The light-blocked pixel block 310 according to the first modified example of the first embodiment is different from the first embodiment in that the reset transistor 321, the floating diffusion layer 324, and the plurality of light-blocked sections 330 are disposed on the light receiving chip 201. The remaining elements are disposed on the circuit chip 202. Note that the elements in the open pixel blocks 340 are disposed on the chips, similarly to the case of the light-blocked pixel blocks 310.

In this way, according to the first modified example of the first embodiment of the present technology, the reset transistor 321 and the like and the plurality of light-blocked sections 330 are disposed on the light receiving chip 201, so that the circuit scale of the circuit chip 202 can be reduced as compared to the first embodiment.

Second Modified Example

In the first modified example of the first embodiment described above, the reset transistor 321 and the like and the plurality of light-blocked sections 330 are disposed on the light receiving chip 201. However, there is a possibility that the circuit chip 202 may have a larger circuit scale as the number of pixels is increased. The solid-state imaging element 200 according to a second modified example of the first embodiment is different from the first modified example of the first embodiment in that the circuit chip 202 has a further reduced circuit scale.

Figure 16:
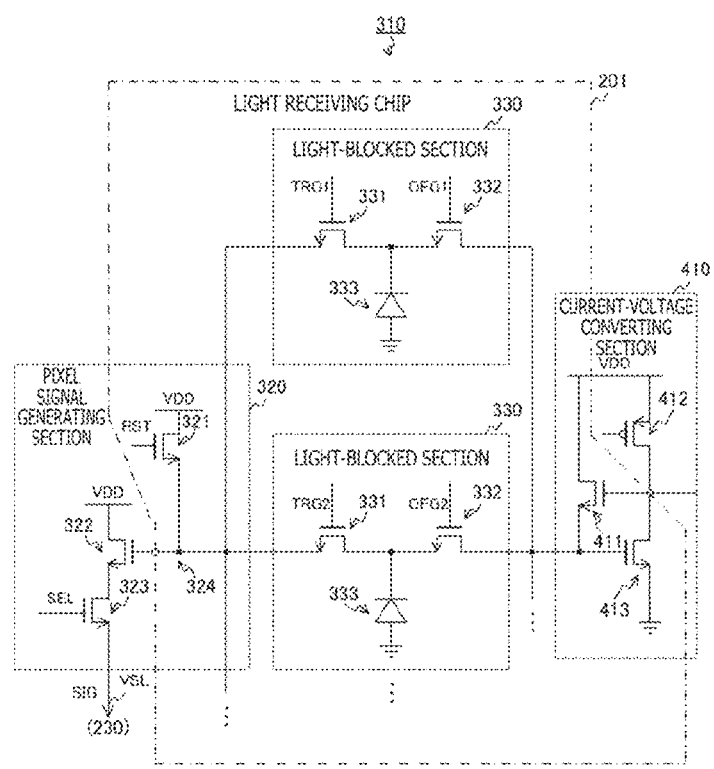
FIG. 16 is a circuit diagram illustrating a configuration example of a light-blocked pixel block according to a second modified example of the first embodiment of the present technology.

FIG. 16 is a circuit diagram illustrating a configuration example of the light-blocked pixel block 310 according to the second modified example of the first embodiment of the present technology. The light-blocked pixel block 310 according to the second modified example of the first embodiment is different from the first modified example of the first embodiment in that the N-type transistors 411 and 413 are further disposed on the light receiving chip 201. In this way, only the N-type transistors are provided in the light receiving chip 201, so that the number of processes for forming the transistors can be reduced as compared to the case where both N-type transistors and P-type transistors are provided. With this, the manufacturing cost of the light receiving chip 201 can be reduced. Note that the elements in the open pixel blocks 340 are disposed on the chips, similarly to the case of the light-blocked pixel blocks 310.

In this way, according to the second modified example of the first embodiment of the present technology, the N-type transistors 411 and 413 are further disposed on the light receiving chip 201, so that the circuit scale of the circuit chip 202 can be reduced as compared to the first modified example of the first embodiment.

Third Modified Example

In the second modified example of the first embodiment described above, the N-type transistors 411 and 413 are further disposed on the light receiving chip 201. However, there is a possibility that the circuit chip 202 may have a larger circuit scale as the number of pixels is increased. The solid-state imaging element 200 according to a third modified example of the first embodiment is different from the second modified example of the first embodiment in that the circuit chip 202 has a further reduced circuit scale.

Figure 17:
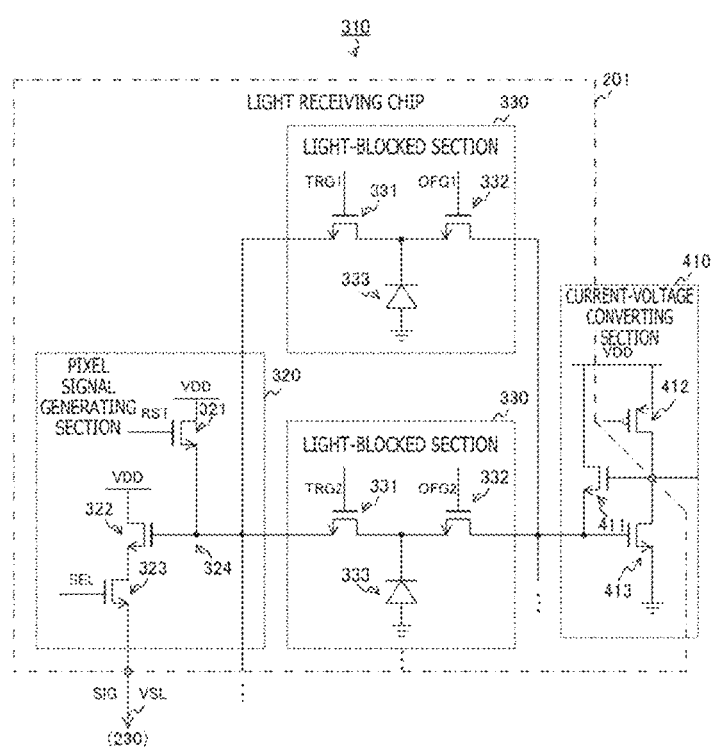
FIG. 17 is a circuit diagram illustrating a configuration example of a light-blocked pixel block according to a third modified example of the first embodiment of the present technology.

FIG. 17 is a circuit diagram illustrating a configuration example of the light-blocked pixel block 310 according to the third modified example of the first embodiment of the present technology. The light-blocked pixel block 310 according to the third modified example of the first embodiment is different from the second modified example of the first embodiment in that the amplification transistor 322 and the selection transistor 323 are also disposed on the light receiving chip 201. That is, all the elements of the pixel signal generating section 320 are disposed on the light receiving chip 201.

In this way, according to the third modified example of the first embodiment of the present technology, the pixel signal generating section 320 is disposed on the light receiving chip 201, so that the circuit scale of the circuit chip 202 can be reduced as compared to the second modified example of the first embodiment.

Fourth Modified Example

In the first embodiment described above, in the calibration mode, correction values are calculated. It is also possible to test whether or not the open pixels have an anomaly. The solid-state imaging element 200 according to a fourth modified example of the first embodiment is different from the first embodiment in that each pixel includes a circuit for testing the presence or absence of the anomaly.

Figure 18:
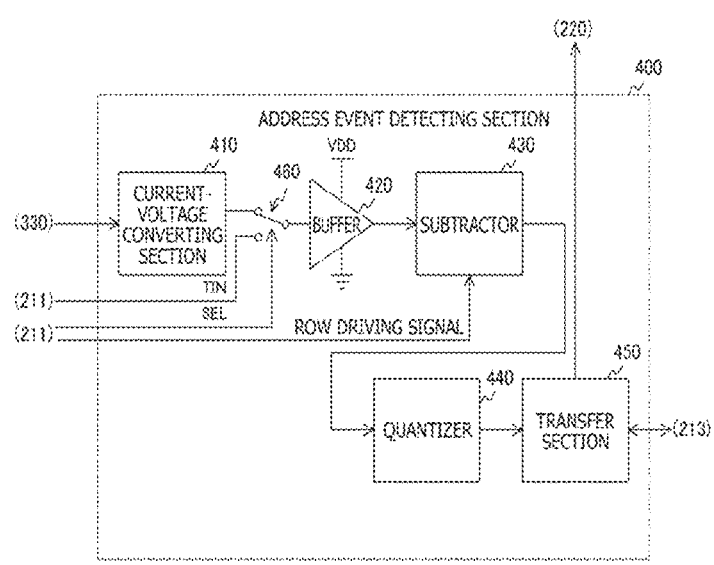
FIG. 18 is a block diagram illustrating a configuration example of an address event detecting section according to a fourth modified example of the first embodiment of the present technology.

FIG. 18 is a block diagram illustrating a configuration example of the address event detecting section 400 in the light-blocked pixel block 310 according to the fourth modified example of the first embodiment of the present technology. The address event detecting section 400 according to the fourth modified example of the first embodiment is different from the first embodiment in further including a selector 460.

The selector 460 selects either a predetermined test signal TIN or a voltage signal from the current-voltage converting section 410. The selector 460 selects, according to the selection signal SEL from the driving circuit 211, either the test signal TIN or the voltage signal and supplies the signal to the buffer 420.

Note that the address event detecting section 343 in the open pixel block 340 is configured similarly to the address event detecting section 400 in the light-blocked pixel block 310.

In the calibration mode, the driving circuit 211 controls, with the selection signal SEL, the selectors 460 to select the test signal TIN for all the pixels. Since address events are not detected when there is an anomaly in the buffer 420 or the subsequent stages, the signal processing section 220 can determine the presence or absence of the anomaly on the basis of detection signals.

Further, the selectors 460 can force all the normal light-blocked pixels 360 to output detection signals irrespective of the presence or absence of address events. With this, irrespective of the presence or absence of address events, pixel signals are output from the light-blocked pixels 360.

Note that the selector 460 is disposed between the current-voltage converting section 410 and the buffer 420, but the present technology is not limited to this configuration. For example, the selector 460 may be disposed between the buffer 420 and the subtractor 430 or between the subtractor 430 and the quantizer 440. Further, two or more selectors 460 can also be disposed. Further, the first to third modified examples are also applicable to the solid-state imaging element 200 of the fourth modified example.

In this way, according to the fourth modified example of the first embodiment of the present technology, the selector 460 configured to select either a test signal or a voltage signal is disposed, so that the signal processing section 220 can determine the presence or absence of the anomaly of each pixel.

2. Second Embodiment

In the first embodiment described above, the current-voltage converting section 410 converts dark currents to voltage signals with the single loop circuit. However, dark currents are generally very small, so that there is a possibility that a sufficient conversion gain cannot be obtained with the single loop circuit. The current-voltage converting section 410 of a second embodiment is different from the first embodiment in that loop circuits in a plurality of stages perform current-voltage conversion.

Figure 19:
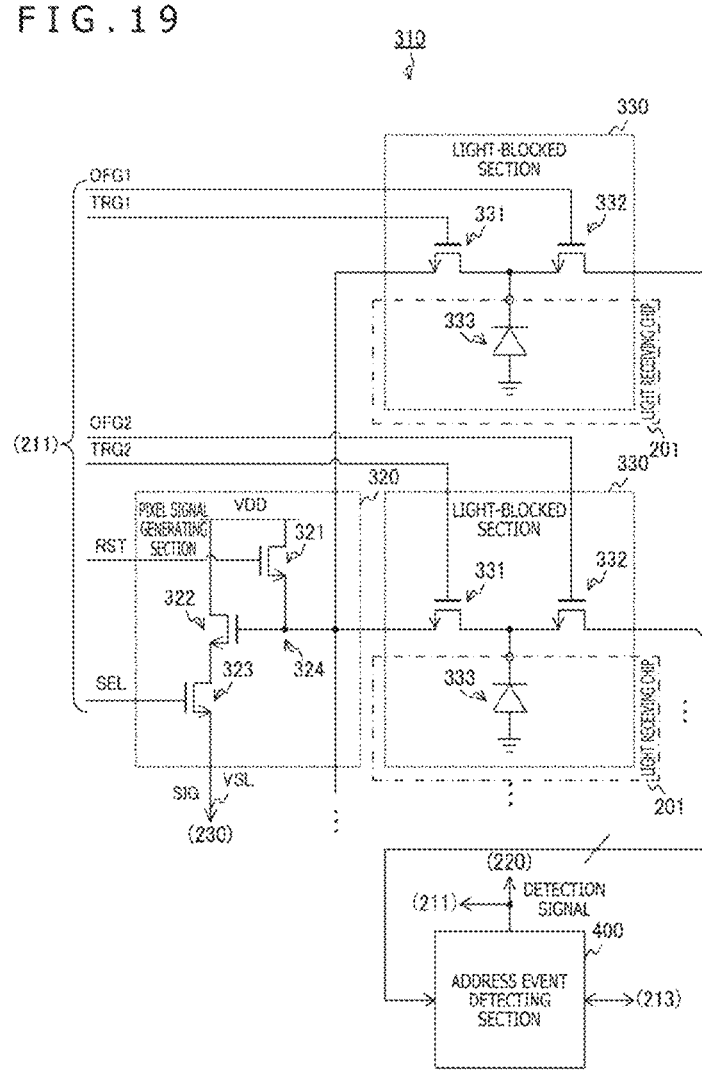
FIG. 19 is a circuit diagram illustrating configuration examples of a pixel signal generating section and light-blocked sections according to a second embodiment of the present technology.

FIG. 19 is a circuit diagram illustrating configuration examples of the pixel signal generating section 320 and the light-blocked sections 330 according to the second embodiment of the present technology. Each of the multiple light-blocked sections 330 of the first embodiment is different from the first embodiment in supplying dark currents to the address event detecting section 400 through signal lines different from each other.

Figure 20:
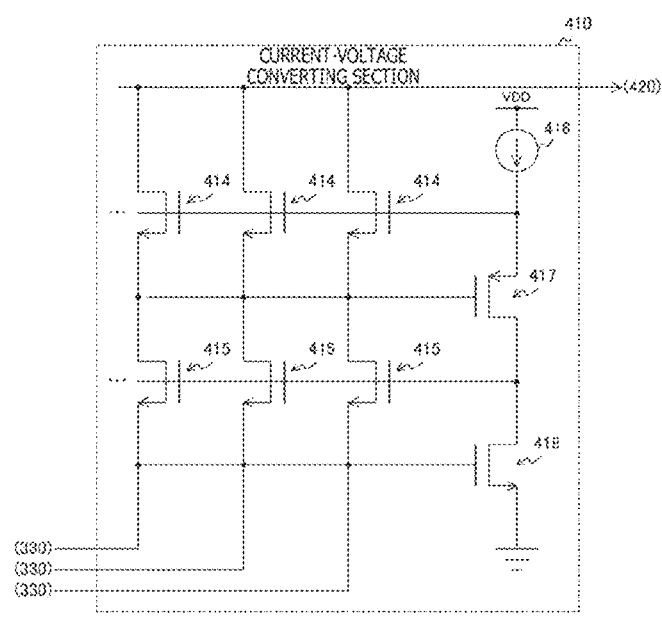
FIG. 20 is a circuit diagram illustrating a configuration example of a current-voltage converting section according to the second embodiment of the present technology.

FIG. 20 is a circuit diagram illustrating a configuration example of the current-voltage converting section 410 according to the second embodiment of the present technology. The current-voltage converting section 410 of the second embodiment includes a plurality of N-type transistors 414, a plurality of N-type transistors 415, a current source 416, and N-type transistors 417 and 418. As the N-type transistors 414, 415, 417, and 418, for example, MOS transistors are used. The N-type transistor 415 and the N-type transistor 417 are disposed for each of the light-blocked pixels 360. When the number of the light-blocked pixels 360 in the light-blocked pixel block 310 is N, the N N-type transistors 415 and the N N-type transistors 417 are disposed.

The N-type transistors 414 and 415 are connected in series between the buffer 420 and the corresponding light-blocked section 330. Further, the current source 416 is connected to the N-type transistors 417 and 418 in series between the power supply terminal and the ground terminal. Further, the N-type transistor 418 has a gate connected to the respective sources of the N N-type transistors 415 in common. The N-type transistor 417 has a gate connected to the respective connection nodes between the N N-type transistors 415 and the N-type transistor 417 in common.

With the configuration described above, the loop circuits in the two stages, that is, the loop circuit including the N-type transistors 415 and 418 and the loop circuit including the N-type transistors 414 and 417, are formed. With the loop circuits in the two stages, the conversion gain for converting dark currents to voltage signals is twice as large as that in the case where a loop circuit in a single stage is used. Further, the average of N voltage signals obtained by converting N dark currents is output to the buffer 420.

Note that the first to fourth modified examples are also applicable to the solid-state imaging element 200 of the second embodiment.

In this way, according to the second embodiment of the present technology, the current-voltage converting section 410 converts dark currents to voltage signals with the loop circuits in the two stages, so that the conversion gain is twice as large as that in the case where a loop circuit in a single stage is used, and higher-level voltage signals can thus be achieved.

3. Third Embodiment

In the first embodiment described above, the light-blocked pixels 360 and the open pixels 370 are both disposed on the same plane of the light receiving chip 201. In this configuration, however, in a case where the area of the light receiving chip 201 is fixed, as the area of the light-blocked region in which the light-blocked pixels 360 are arrayed is increased, the area of the open region in which the open pixels 370 are arrayed is decreased. The solid-state imaging element 200 of a third embodiment is different from the first embodiment in that only the light-blocked pixels 360 are arrayed on the light receiving surface and that the light-blocked pixels 360 are arrayed on a surface facing the light receiving surface.

Figure 21:
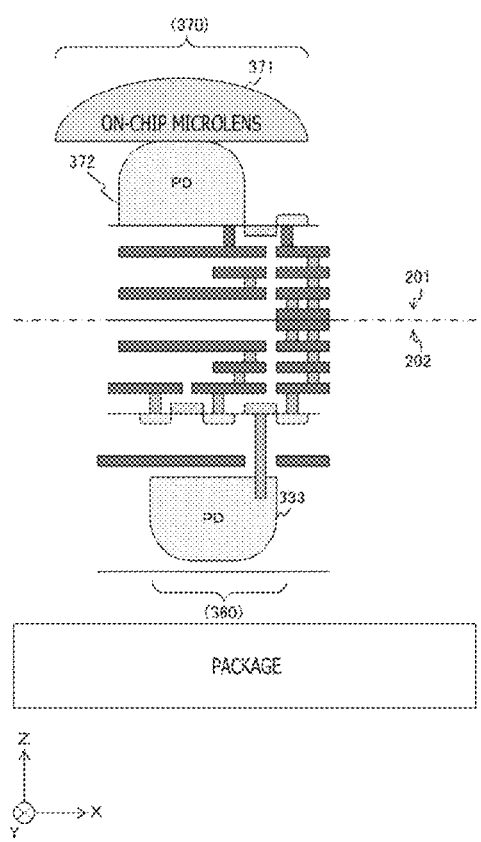
FIG. 21 is an example of a sectional view of a solid-state imaging element according to a third embodiment of the present technology.

FIG. 21 is an example of a sectional view of the solid-state imaging element 200 according to the third embodiment of the present technology. The sectional view represents the sectional view of a predetermined cross section parallel to the Z direction. The solid-state imaging element 200 has a pair of planes facing each other. These planes are vertical to the Z direction. One of the planes is used as the light receiving surface on which the open pixels 370 are arrayed. Further, the light-blocked pixels 360 are arrayed on the other plane. In the case of the stacked structure, the open pixels 370 are arrayed on the light receiving chip 201, and the light-blocked pixels 360 are arrayed on the circuit chip 202. The surface on which the light-blocked pixels 360 are arrayed faces a package, for example, and is not exposed to light. Further, light entering the light receiving surface is blocked by the wiring or the circuits so as to be prevented from reaching the light-blocked pixels 360 on the other surface. Thus, no light-blocking member is needed.

Figure 22:
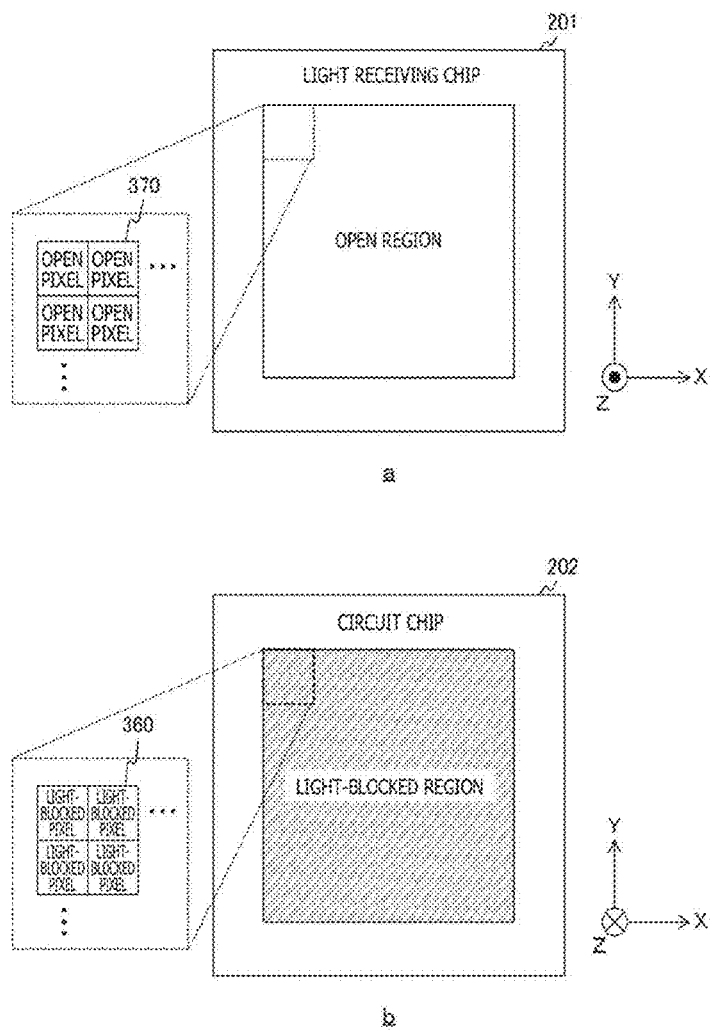
FIG. 22 represents examples of plan views of a light receiving chip and a circuit chip according to the third embodiment of the present technology.

FIG. 22 represents examples of plan views of the light receiving chip 201 and the circuit chip 202 according to the third embodiment of the present technology. Here, a of FIG. 22 is the example of the plan view of the light receiving chip 201, and b of FIG. 22 is the example of the plan view of the circuit chip 202.

In the open region in the light receiving chip 201, the plurality of open pixels 370 is arrayed in a two-dimensional lattice pattern. Further, in the light-blocked region in the circuit chip 202, the plurality of light-blocked pixels 360 is arrayed in a two-dimensional lattice pattern. In the light-blocked region, for example, the same number of the light-blocked pixels 360 as the open pixels 370 are arrayed.

Note that the number of the light-blocked pixels 360 can also be smaller than that of the open pixels 370. In this case, for example, as exemplified in a of FIG. 23, the multiple light-blocked pixel blocks 310 each including the N light-blocked pixels 360 can also be arrayed to be away from each other at certain intervals in a two-dimensional lattice pattern. Further, as exemplified in b of FIG. 23, the light-blocked pixels 360 can also be irregularly disposed.

FIG. 24 is a block diagram illustrating configuration examples of the open pixel 370 and the light-blocked pixel 360 according to the third embodiment of the present technology.

The open pixel 370 includes the photoelectric conversion element 372, a current-voltage converting section 480, a buffer 471, a subtractor 472, a quantizer 473, and a transfer section 474. The buffer 471, the subtractor 472, the quantizer 473, and the transfer section 474 are configured similarly to the corresponding circuits in the address event detecting section 400 exemplified in FIG. 8.

The photoelectric conversion element 372 of the third embodiment supplies photocurrents to the current-voltage converting section 480.

Further, the light-blocked pixel 360 of the third embodiment includes the photoelectric conversion element 333 and the OFG transistor 332. The OFG transistor 332 outputs, according to the control signal OFGn, charges from the photoelectric conversion element 333 to the current-voltage converting section 480. With this, a dark current flows from the current-voltage converting section 480 to the photoelectric conversion element 333. This dark current is used as a correction signal for correcting dark current noise.

Further, the solid-state imaging element 200 of the third embodiment is not set to the calibration mode. In address event detection, the driving circuit 211 controls, with the control signal OFGn, the pixel to output charges from the photoelectric conversion element 333 to the current-voltage converting section 480.

The current-voltage converting section 480 converts a difference between a photocurrent generated by the photoelectric conversion element 372 and a dark current, to a voltage signal. With this, dark current noise can be reduced.

As described above, the open pixel 370 of the third embodiment detects the presence or absence of address events but does not output pixel signals. Further, the light-blocked pixel 360 of the third embodiment outputs dark currents but does not output either address event detection signals or pixel signals.

Figure 25:
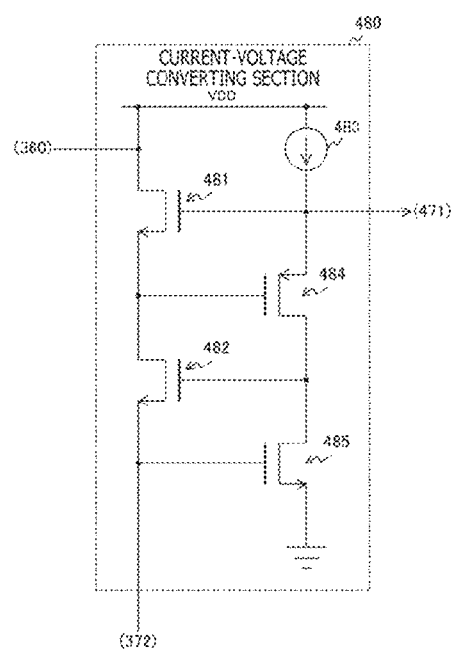
FIG. 25 is a circuit diagram illustrating a configuration example of a current-voltage converting section according to the third embodiment of the present technology.

FIG. 25 is a circuit diagram illustrating a configuration example of the current-voltage converting section 480 according to the third embodiment of the present technology. The current-voltage converting section 480 of the third embodiment includes N-type transistors 481, 482, 484, 485, and 486, and a current source 483.

The N-type transistors 481 and 482 are connected in series between a terminal having a power supply voltage VDD and the photoelectric conversion element 372. Further, the N-type transistor 481 has a drain connected to the light-blocked pixel 360. The current source 483 is connected to the N-type transistors 484 and 485 in series between the terminal having the power supply voltage VDD and the ground terminal.

Further, the N-type transistor 481 has a gate connected to the connection node between the current source 483 and the N-type transistor 484. The N-type transistor 482 has a gate connected to the connection node between the N-type transistors 484 and 485. The N-type transistor 484 has a gate connected to the connection node between the N-type transistors 481 and 482. The N-type transistor 485 has a gate connected to the connection node between the N-type transistor 482 and the photoelectric conversion element 372. Further, the connection node between the current source 483 and the N-type transistor 484 is connected to the buffer 471.

With the configuration described above, a difference between a dark current generated in the light-blocked pixel 360 and a photocurrent generated in the photoelectric conversion element 372 is converted to a voltage signal. A voltage signal is generated by using a difference between a dark current and a photocurrent, so that dark current noise in a detection signal obtained from the voltage signal can be reduced.

Note that, while the open pixels 370 and the light-blocked pixels 360 of the third embodiment do not output pixel signal, it is also possible to configure them so as to output pixel signals and correct the pixel signals with correction values as in the first embodiment.

In this way, according to the third embodiment of the present technology, the open pixels 370 are arrayed on one of the pair of planes facing each other, and the light-blocked pixels 360 are arrayed on the other plane, so that the region in which the open pixels 370 are arrayed can be widened as compared to the case where those pixels are arrayed on the same plane.

Further, the current-voltage converting section 410 converts, to a voltage signal, a difference between a dark current from the light-blocked pixel 360 and a photocurrent generated in the photoelectric conversion element 372 in the open pixel 370, so that dark current noise in the voltage signal can be removed.

4. Fourth Embodiment

In the first embodiment described above, noise such as dark current noise is removed from pixel signals of the open pixels 370. However, there is a possibility that, in address event detection, detection errors occur due to the effect of dark current noise or the like. The solid-state imaging element 200 of a fourth embodiment is different from the first embodiment in that the detection accuracy of address events is enhanced.

Figure 26:
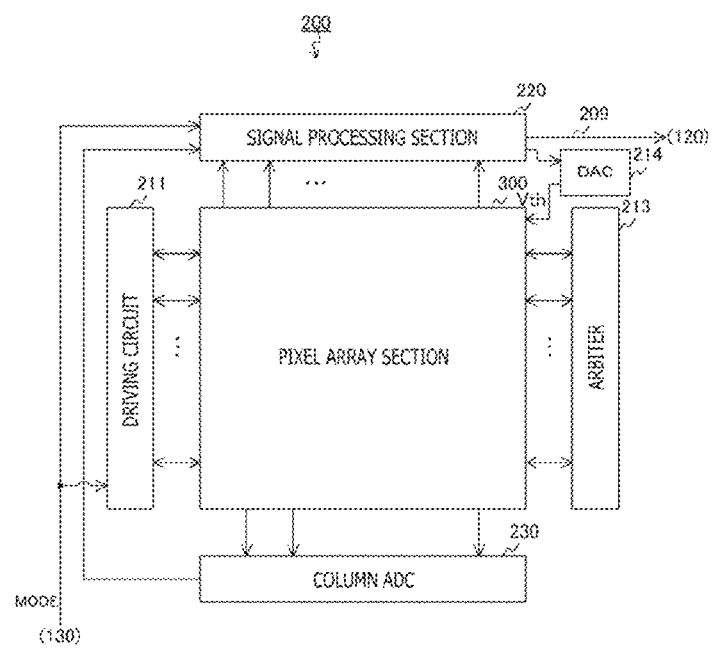
FIG. 26 is a block diagram illustrating a configuration example of a solid-state imaging element according to a fourth embodiment of the present technology.

FIG. 26 is a block diagram illustrating a configuration example of the solid-state imaging element 200 according to the fourth embodiment of the present technology. The solid-state imaging element 200 of the fourth embodiment is different from the first embodiment in further including an DAC 214.

The DAC 214 performs DA conversion on a control signal from the signal processing section 220 to generate the threshold voltage Vth. The DAC 214 supplies the threshold voltage Vth to the open pixels 370 and the light-blocked pixels 360 in the pixel array section 300.

Figure 27:
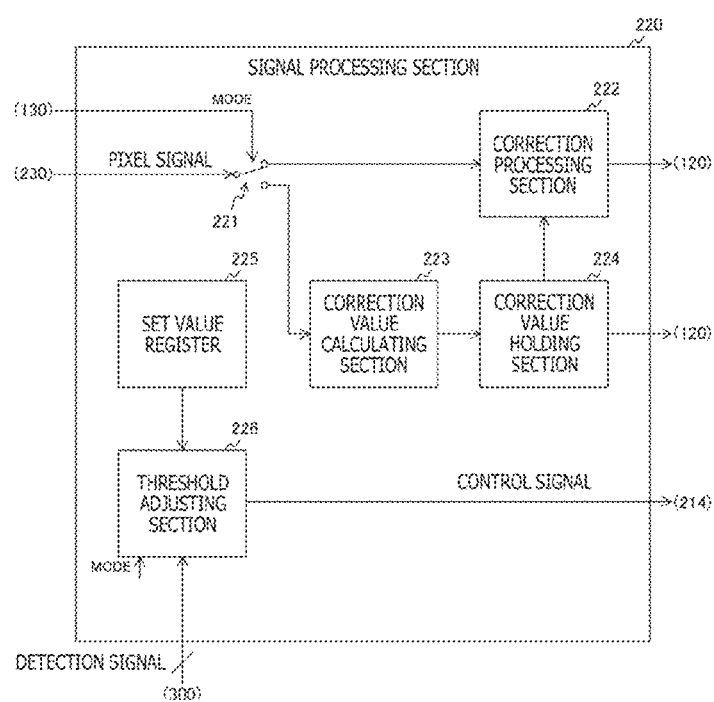
FIG. 27 is a block diagram illustrating a configuration example of a signal processing section according to the fourth embodiment of the present technology.

FIG. 27 is a block diagram illustrating a configuration example of the signal processing section 220 according to the fourth embodiment of the present technology. The signal processing section 220 of the fourth embodiment is different from the first embodiment in further including a set value register 225 and a threshold adjusting section 226.

The threshold adjusting section 226 adjusts the threshold voltage Vth, which indicates the threshold, with a control signal that is transmitted to the DAC 214. The threshold adjusting section 226 receives respective detection signals from the plurality of light-blocked pixels in the pixel array section 300.

In the calibration mode, the threshold adjusting section 226 obtains a detection signal detection frequency and reads out a set value corresponding to the detection frequency from the set value register 225. Then, the threshold adjusting section 226 updates, with a control signal, the threshold voltage Vth to a voltage indicating the set value. Through the appropriate update of the threshold voltage Vth, address event detection errors due to dark current noise or offset noise can be prevented.

The set value register 225 holds set values based on detection frequencies. The set values include an upper limit set value indicating an upper limit threshold and a lower limit set value indicating a lower limit threshold. For example, the higher the on-event output frequency is, the lower the upper limit set value is held. On the other hand, the higher the off-event detection frequency is, the higher the lower limit set value is held.

Note that the set value register 225 can also hold only the upper limit set value. Further, while the threshold adjusting section 226 reads out the set values from the set value register 225, the threshold adjusting section 226 can also obtain the set values by performing predetermined calculation on detection frequencies. In this case, the set value register 225 is not needed. Further, the first to fourth modified examples are also applicable to the solid-state imaging element 200 of the fourth embodiment.

In this way, according to the fourth embodiment of the present technology, the threshold adjusting section 226 updates the threshold voltage to a value based on the address event detection frequency of the light-blocked pixel 360, so that address event detection errors due to noise can be prevented, and the detection accuracy can thus be enhanced.

[Imaging device according to fifth embodiment (scan type)] The imaging device 20 according to the first configuration example described above is the asynchronous imaging device configured to read out events by the asynchronous readout system. However, the event readout system is not limited to the asynchronous readout system and may be the synchronous readout system. An imaging device to which the synchronous readout system is applied is a scan type imaging device that is the same as a general imaging device configured to perform imaging at a predetermined frame rate.

Figure 28:
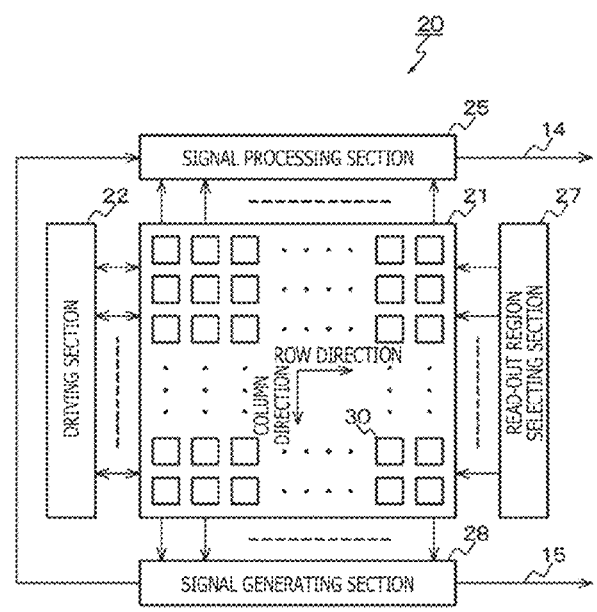
FIG. 28 is a block diagram illustrating an example of the configuration of an imaging device according to a fifth embodiment of the present technology.

FIG. 28 is a block diagram illustrating an example of the configuration of an imaging device according to a second configuration example that is used as the imaging device 20 in an imaging system 10 to which the technology according to the present disclosure is applied, that is, a scan type imaging device.

As illustrated in FIG. 28, the imaging device 20 according to the second configuration example, which serves as the imaging device of the present disclosure, includes a pixel array section 21, a driving section 22, a signal processing section 25, a read-out region selecting section 27, and a signal generating section 28.

The pixel array section 21 includes multiple pixels 30. The multiple pixels 30 each output an output signal according to a selection signal from the read-out region selecting section 27. The multiple pixels 30 each include the light receiving section 342 illustrated in FIG. 5. Further, as illustrated in FIG. 5, the pixel signal generating section 341 and the address event detecting section 343 are shared by the multiple pixels 30 (light receiving sections 342). The multiple pixels 30 output signals corresponding to the amounts of change in light intensity. The multiple pixels 30 may be two-dimensionally disposed in a matrix as illustrated in FIG. 28.

The driving section 22 drives the respective multiple pixels 30 such that the pixels 30 output, to the signal processing section 25, pixel signals generated by the respective pixels 30. Note that the driving section 22 and the signal processing section 25 are circuit sections for acquiring grayscale information. Thus, in a case where only event information is acquired, the driving section 22 and the signal processing section 25 may be omitted.

The read-out region selecting section 27 selects some of the multiple pixels 30 included in the pixel array section 21. Specifically, the read-out region selecting section 27 determines a selection region on the basis of requests from the pixels 30 in the pixel array section 21. For example, the read-out region selecting section 27 selects any one or a plurality of rows included in the two-dimensional matrix structure corresponding to the pixel array section 21. The read-out region selecting section 27 sequentially selects one or a plurality of rows on the basis of a cycle set in advance. Further, the read-out region selecting section 27 may determine a selection region on the basis of requests from the pixels 30 in the pixel array section 21.

The signal generating section 28 generates, on the basis of output signals of pixels selected by the read-out region selecting section 27, event signals corresponding to active pixels of the selected pixels in which events have been detected. The events mean an event in which the intensity of light changes. The active pixels are each a pixel in which the amount of change in light intensity corresponding to an output signal exceeds or falls below a threshold set in advance. For example, the signal generating section 28 compares output signals from the pixels to a reference signal and detects, as an active pixel, a pixel that outputs a signal larger or smaller than the reference signal. The signal generating section 28 generates an event signal corresponding to the active pixel.

The signal generating section 28 can include, for example, a column selecting circuit configured to arbitrate signals input to the signal generating section 28. Further, the signal generating section 28 can output not only information regarding active pixels in which events have been detected, but also information regarding non-active pixels in which no event has been detected.

The signal generating section 28 outputs, through an output line 15, address information and timestamp information (for example, (X, Y, T)) regarding the active pixels in which the events have been detected. However, the data that is output from the signal generating section 28 may be not only the address information and the timestamp information but also information in a frame format (for example, (0, 0, 1, 0, . . . )).

<5. Application Example to Mobile Body>

The technology according to the present disclosure (present technology) is applicable to various products. For example, the technology according to the present disclosure may be realized as a device that is installed on any kind of moving bodies such as vehicles, electric vehicles, hybrid electric vehicles, motorcycles, bicycles, personal mobilities, airplanes, drones, ships, and robots.

Figure 29:
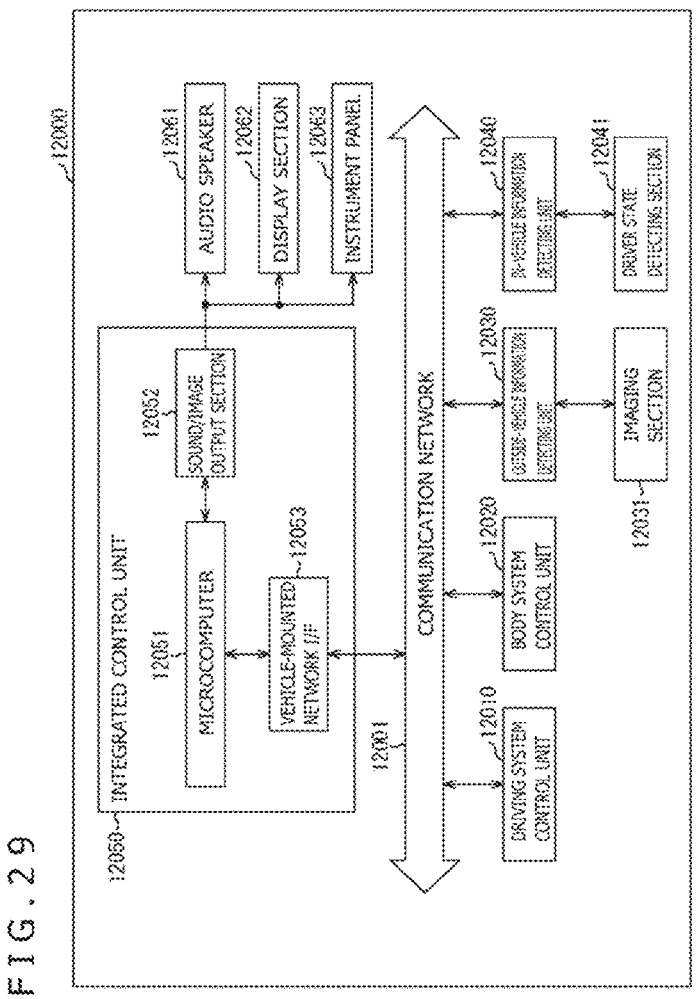
FIG. 29 is a block diagram depicting an example of schematic configuration of a vehicle control system.

FIG. 29 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 29, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 29, an audio speaker 12061, a display section 12062, and an instrument panel 12063 are illustrated as the output device. The display section 12062 may, for example, include at least one of an on-board display and a head-up display.

Figure 30:
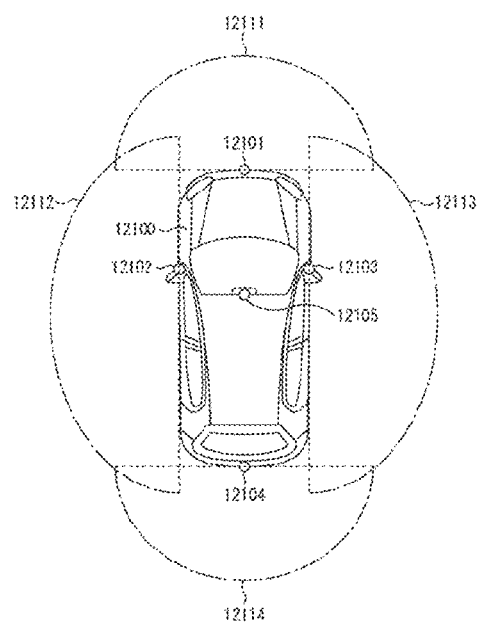
FIG. 30 is a diagram of assistance in explaining an example of installation positions of an outside-vehicle information detecting section and an imaging section.

FIG. 30 is a diagram depicting an example of the installation position of the imaging section 12031.

In FIG. 30, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 30 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure is applicable has been described above. The technology according to the present disclosure is applicable to the imaging section 12031 among the above-mentioned configurations. Specifically, for example, the imaging device 100 of FIG. 1 is applicable to the imaging section 12031. The imaging section 12031 to which the technology according to the present disclosure has been applied can obtain easy-to-read captured images and thus reduce the fatigue of drivers.

Note that the above-mentioned embodiments are examples for implementing the present technology, and the matters in the embodiments have correspondence relationships with matters defining the invention in scope of claims. In a similar manner, the matters defining the invention in scope of claims have correspondence relationships with the matters in the embodiments of the present technology denoted by the same names. However, the present technology is not limited to the embodiments, and various modifications of the embodiments can be implemented without departing from the gist of the present technology.

Note that the present technology can also take the following configurations.

(1)

A solid-state imaging element including:

open pixels each configured to detect whether or not an amount of change in incident light amount exceeds a predetermined threshold and to output a detection signal indicating a result of the detection; and light-blocked pixels each configured to output a correction signal based on an amount of noise generated in the open pixels.

(2)

The solid-state imaging element according to (1), in which the open pixels and the light-blocked pixels are arrayed on a predetermined plane.

(3)

The solid-state imaging element according to (1), in which the open pixels are arrayed on one of a pair of planes facing each other, and the light-blocked pixels are arrayed on the other of the pair of planes.

(4)

The solid-state imaging element according to (3), in which the light-blocked pixels and the open pixels are disposed on a one-to-one basis.

(5)

The solid-state imaging element according to (3), in which, on the other of the pair of planes, multiple light-blocked pixel blocks each including a predetermined number of the light-blocked pixels are arrayed, and the multiple light-blocked pixel blocks are arrayed to be away from each other at certain intervals.

(6)

The solid-state imaging element according to (3), in which the light-blocked pixels are irregularly disposed.

(7)

The solid-state imaging element according to any one of (1) to (8), further including:

a signal processing section configured to perform, according to the correction signal, correction processing of removing the noise from a pixel signal based on the light amount, in which the open pixels each further output the pixel signal.

(8)

The solid-state imaging element according to any one of (1) to (7), in which the light-blocked pixels each include a photoelectric conversion element, a current-voltage converting section configured to convert a dark current generated in the photoelectric conversion element to a voltage signal, a quantizer configured to detect whether or not an amount of change in the voltage signal exceeds the threshold, and a pixel signal generating section configured to generate a pixel signal based on the light amount as the correction signal.

(9)

The solid-state imaging element according to (8), in which the current-voltage converting section converts the dark current to the voltage signal with loop circuits in a plurality of stages.

(10)

The solid-state imaging element according to (8), in which the photoelectric conversion element and a part of the pixel signal generating section are disposed on a predetermined light receiving chip, and a remaining part of the pixel signal generating section, the current-voltage converting section, and the quantizer are disposed on a predetermined circuit chip.

(11)

The solid-state imaging element according to (8), in which the photoelectric conversion element, a part of the pixel signal generating section, and a part of the current-voltage converting section are disposed on a predetermined light receiving chip, and a remaining part of the pixel signal generating section, a remaining part of the current-voltage converting section, and the quantizer are disposed on a predetermined circuit chip.

(12)

The solid-state imaging element according to (8), in which the photoelectric conversion element, the pixel signal generating section, and a part of the current-voltage converting section are disposed on a predetermined light receiving chip, and a remaining part of the current-voltage converting section and the quantizer are disposed on a predetermined circuit chip.

(13)

The solid-state imaging element according to any one of (8) to (12), in which the light-blocked pixels each further include a selector configured to select and output either a predetermined test signal or the voltage signal as a selection signal, and the quantizer detects whether or not an amount of change in the selection signal exceeds the threshold.

(14)

The solid-state imaging element according to (1), in which the open pixels each include a photoelectric conversion element configured to generate a photocurrent by photoelectric conversion, a current-voltage converting section configured to convert a difference between the photocurrent and a dark current to a voltage signal, and a quantizer configured to detect whether or not an amount of change in the voltage signal exceeds the threshold, and the light-blocked pixels each output the dark current as the correction signal.

(15)

The solid-state imaging element according to (1), further including:

a threshold adjusting section configured to adjust the threshold based on the correction signal.

(16)

An imaging device including:

open pixels each configured to detect whether or not an amount of change in incident light amount exceeds a predetermined threshold and to indicate a result of the detection;

light-blocked pixels each configured to output a correction signal based on an amount of noise generated in the open pixels; and a signal processing section configured to process the detection signal.

REFERENCE SIGNS LIST

100 Imaging device
110 Imaging lens
120 Recording section
130 Control section
200 Solid-state imaging element
201 Light receiving chip
202 Circuit chip
211 Driving circuit
213 Arbiter
214 DAC
220 Signal processing section
221, 434 Switch
222 Correction processing section
223 Correction value calculating section
224 Correction value holding section
225 Set value register
226 Threshold adjusting section
230 Column ADC
231 ADC
300 Pixel array section
310 Light-blocked pixel block
320, 341 Pixel signal generating section
321 Reset transistor
322 Amplification transistor
323 Selection transistor
324 Floating diffusion layer
330 Light-blocked section
331 Transfer transistor
332 OFG transistor
333, 372 Photoelectric conversion element
340 Open pixel block
342 Light receiving section
343, 400 Address event detecting section
360 Light-blocked pixel
361, 371 On-chip microlens
362 Light-blocking member
370 Open pixel
410, 480 Current-voltage converting section
411, 413, 414, 415, 417, 418, 481, 482, 484, 485 N-type transistor
412 P-type transistor
416, 483 Current source
420, 471 Buffer
430, 472 Subtractor
431, 433 Capacitor
432 Inverter
440, 473 Quantizer
441 Comparator
450, 474 Transfer section
460 Selector
12031 Imaging section

The invention claimed is:

1. A light detecting device, comprising:
a first substrate including:
  a first open pixel having at least:
    a first photoelectric conversion element configured to generate a charge
  by photoelectric conversion;
    a first reset transistor;
    a first amplification transistor; and
    a first selection transistor;
  a second open pixel having at least:
    a second photoelectric conversion element configured to generate a charge by photoelectric conversion; and
    a first portion of a first current-voltage converter including a first transistor and a second transistor;
  a first light-blocked pixel having at least:
    a third photoelectric conversion element configured to generate a charge by photoelectric conversion;
    a first light-blocking member portion provided over the third photoelectric
  conversion element;
    a second reset transistor;
    a second amplification transistor; and
    a second selection transistor; and
  a second light block pixel having at least:
    a fourth photoelectric conversion element configured to generate a charge by photoelectric conversion;
    a second light-blocking member portion provided over the fourth photoelectric conversion element; and
    a portion of a second current-voltage converter including a third transistor and a fourth transistor; and
a second substrate stacked on the first substrate including:
  a first circuit having at least a first analog-to-digital converter coupled to the first selection transistor of the first open pixel;
  a second circuit having at least:
    a second portion of the first current-voltage converter including a fifth transistor coupled to the first transistor and the second transistor; and a quantizer coupled to the fifth transistor; and
a third circuit having at least a second analog-to-digital converter coupled to the second selection transistor of the second light-block pixel.

2. The light detecting device according to claim 1, wherein the first and second open pixels are provided within a center portion of a pixel array of the first substrate.

3. The light detecting device according to claim 1, wherein the first and second light-blocked pixels are provided around the center portion of the pixel array of the first substrate.

4. The light detecting device according to claim 1, wherein each of the first and second open pixels and each of the first and second light-blocked pixels includes a microlens.

5. The light detecting device according to claim 4, wherein the first light-blocking member is provided between the microlens and the third photoelectric conversion element and the second light-blocking member is provided between the microlens and the fourth photoelectric conversion member.

6. The light detecting device according to claim 1, wherein the first and second transistors are N-type metal oxide semiconductor (MOS) transistors.

7. The light detecting device according to claim 1, wherein the third and fourth transistors are N-type metal oxide semiconductor (MOS) transistors.

8. The light detecting device according to claim 6, wherein the fifth transistor is a P-type MOS transistor.

9. The light detecting device according to claim 1, wherein the second circuit further includes a buffer that receives voltage signals from the second portion of the first current-voltage converter.

10. The light detecting device according to claim 1, wherein the quantizer is configured to detect whether or not an amount of change in the voltage signals from the first current-voltage converter exceeds a threshold value.

11. An imaging device, comprising:
an optical system;
a light detecting device that receives light from the optical system, the light detecting device, including:
a first substrate including:
a first open pixel having at least:
a first photoelectric conversion element configured to generate a charge by photoelectric conversion;
a first reset transistor;
a first amplification transistor; and
a first selection transistor;
a second open pixel having at least:
a second photoelectric conversion element configured to generate a charge by photoelectric conversion; and
a first portion of a first current-voltage converter including a first transistor and a second transistor;
a first light-blocked pixel having at least:
a third photoelectric conversion element configured to generate a charge by photoelectric conversion;
a first light-blocking member portion provided over the third photoelectric conversion element;
a second reset transistor;
a second amplification transistor; and
a second selection transistor; and
a second light block pixel having at least:
a fourth photoelectric conversion element configured to generate a charge by photoelectric conversion;
a second light-blocking member portion provided over the fourth photoelectric conversion element; and
a portion of a second current-voltage converter including a third transistor and a fourth transistor; and
a second substrate stacked on the first substrate including:
a first circuit having at least a first analog-to-digital converter coupled to the first selection transistor of the first open pixel;
a second circuit having at least:
a second portion of the first current-voltage converter including a fifth transistor coupled to the first transistor and the second transistor; and
a quantizer coupled to the fifth transistor; and
a third circuit having at least a second analog-to-digital converter coupled to the second selection transistor of the second light-block pixel; and
a digital signal processor that processes signals received from the light detecting device.

12. The imaging device according to claim 11, wherein the first and second open pixels are provided within a center portion of a pixel array of the first substrate.

13. The imaging device according to claim 11, wherein the first and second light-blocked pixels are provided around the center portion of the pixel array of the first substrate.

14. The imaging device according to claim 11, wherein each of the first and second open pixels and each of the first and second light-blocked pixels includes a microlens.

15. The imaging device according to claim 14, wherein the first light-blocking member is provided between the microlens and the third photoelectric conversion element and the second light-blocking member is provided between the microlens and the fourth photoelectric conversion member.

16. The imaging device according to claim 11, wherein the first and second transistors are N-type metal oxide semiconductor (MOS) transistors.

17. The imaging device according to claim 11, wherein the third and fourth transistors are N-type metal oxide semiconductor (MOS) transistors.

18. The imaging device according to claim 16, wherein the fifth transistor is a P-type MOS transistor.

19. The imaging device according to claim 11, wherein the second circuit further includes a buffer that receives voltage signals from the second portion of the first current-voltage converter.

20. The imaging device according to claim 11, wherein the quantizer is configured to detect whether or not an amount of change in the voltage signals from the first current-voltage converter exceeds a threshold value.

* * * * *